(12) United States Patent
Horigome

(10) Patent No.: US 7,554,293 B2
(45) Date of Patent: Jun. 30, 2009

(54) ELECTRIC CHARGING APPARATUS, ELECTRONIC APPARATUS, RESIDUAL BATTERY CAPACITY DETECTION METHOD AND BATTERY RESIDUAL CAPACITY DISPLAY CONTROL METHOD

(75) Inventor: Hideo Horigome, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 288 days.

(21) Appl. No.: 10/758,074

(22) Filed: Jan. 16, 2004

(65) Prior Publication Data

US 2004/0150368 A1   Aug. 5, 2004

(30) Foreign Application Priority Data

Jan. 24, 2003   (JP) .............................. 2003-016719

(51) Int. Cl.
*H02J 7/00* (2006.01)
*G08B 21/00* (2006.01)

(52) U.S. Cl. ..................... 320/132; 320/107; 340/636.1

(58) Field of Classification Search ................ 320/132, 320/107; 340/636.1
See application file for complete search history.

(56) References Cited

U.S. PATENT DOCUMENTS

| | | | |
|---|---|---|---|
| 5,371,453 A | 12/1994 | Fernandez | |
| 5,448,153 A | 9/1995 | Ikeda et al. | .................... 320/30 |
| 5,525,888 A * | 6/1996 | Toya | .......................... 320/111 |
| 5,563,493 A | 10/1996 | Matsuda | |
| 5,565,757 A | 10/1996 | Ikeda et al. | .................... 320/30 |
| 5,631,677 A * | 5/1997 | Horigome et al. | ............. 347/19 |
| 5,721,481 A | 2/1998 | Narita | |
| 5,731,683 A | 3/1998 | Nakanishi | |
| 6,229,280 B1 | 5/2001 | Sakoh | |
| 6,412,900 B2 | 7/2002 | Horigome | |
| 6,424,124 B2 | 7/2002 | Ichihara et al. | ............. 320/149 |
| 6,522,361 B2 | 2/2003 | Higuchi et al. | .............. 348/372 |
| 6,563,766 B1 * | 5/2003 | Nakamiya | ..................... 368/64 |
| 6,624,610 B1 | 9/2003 | Ono et al. | .................... 320/104 |
| 2004/0150368 A1 | 8/2004 | Horigome | |
| 2004/0150704 A1 | 8/2004 | Horigome | ................... 347/109 |

FOREIGN PATENT DOCUMENTS

| | | |
|---|---|---|
| CN | 1302148 A | 7/2001 |
| CN | 1075680 C | 11/2001 |

(Continued)

OTHER PUBLICATIONS

"Dual Battery Charger for External Notebook Computer Options", IBM Technical Disclosure Bulletin, vol. 38, No. 4, Apr. 1995, pp. 433-434.

*Primary Examiner*—Adolf Berhane
*Assistant Examiner*—Yalkew Fantu
(74) *Attorney, Agent, or Firm*—Fitzpatrick, Cella, Harper & Scinto

(57) ABSTRACT

According to one aspect of the invention, a battery charging apparatus including a battery pack, which is attachable/removable to/from an ink jet printer which can be driven with electric power from the battery pack. The battery charging apparatus has a serial communication unit which receives battery residual capacity information, detected by the ink jet printer, from the ink jet printer, and a display unit which displays a battery residual capacity based on the residual capacity information received by the serial communication unit.

2 Claims, 20 Drawing Sheets

FOREIGN PATENT DOCUMENTS

| | | |
|---|---|---|
| CN | 1342123 A | 3/2002 |
| EP | 0587385 | 3/1994 |
| JP | 04-075433 | 10/1992 |
| JP | 4-317526 | 11/1992 |
| JP | 5-284659 | 10/1993 |
| JP | 6-183103 | 7/1994 |
| JP | 6-217464 | 8/1994 |
| JP | 6-327162 | 11/1994 |
| JP | 8-149718 | 6/1996 |
| JP | 8-251830 | 9/1996 |
| JP | 9-9624 | 1/1997 |
| JP | 9-297166 | 11/1997 |
| JP | 10-217578 | 8/1998 |
| JP | 10-094177 | 10/1998 |
| JP | 10-285826 | 10/1998 |
| JP | 11-138951 | 5/1999 |
| JP | 11-266543 | 9/1999 |
| JP | 2000-184614 | 6/2000 |
| JP | 2000-253591 | 9/2000 |
| JP | 2000-287377 | 10/2000 |
| JP | 2001-186676 | 7/2001 |
| JP | 2001-215262 | 8/2001 |
| JP | 2002-59615 | 2/2002 |
| JP | 2002-124226 | 4/2002 |
| JP | 2002-228731 | 8/2002 |
| JP | 2004-229449 | 8/2004 |
| WO | 00/51878 | 9/2000 |

* cited by examiner

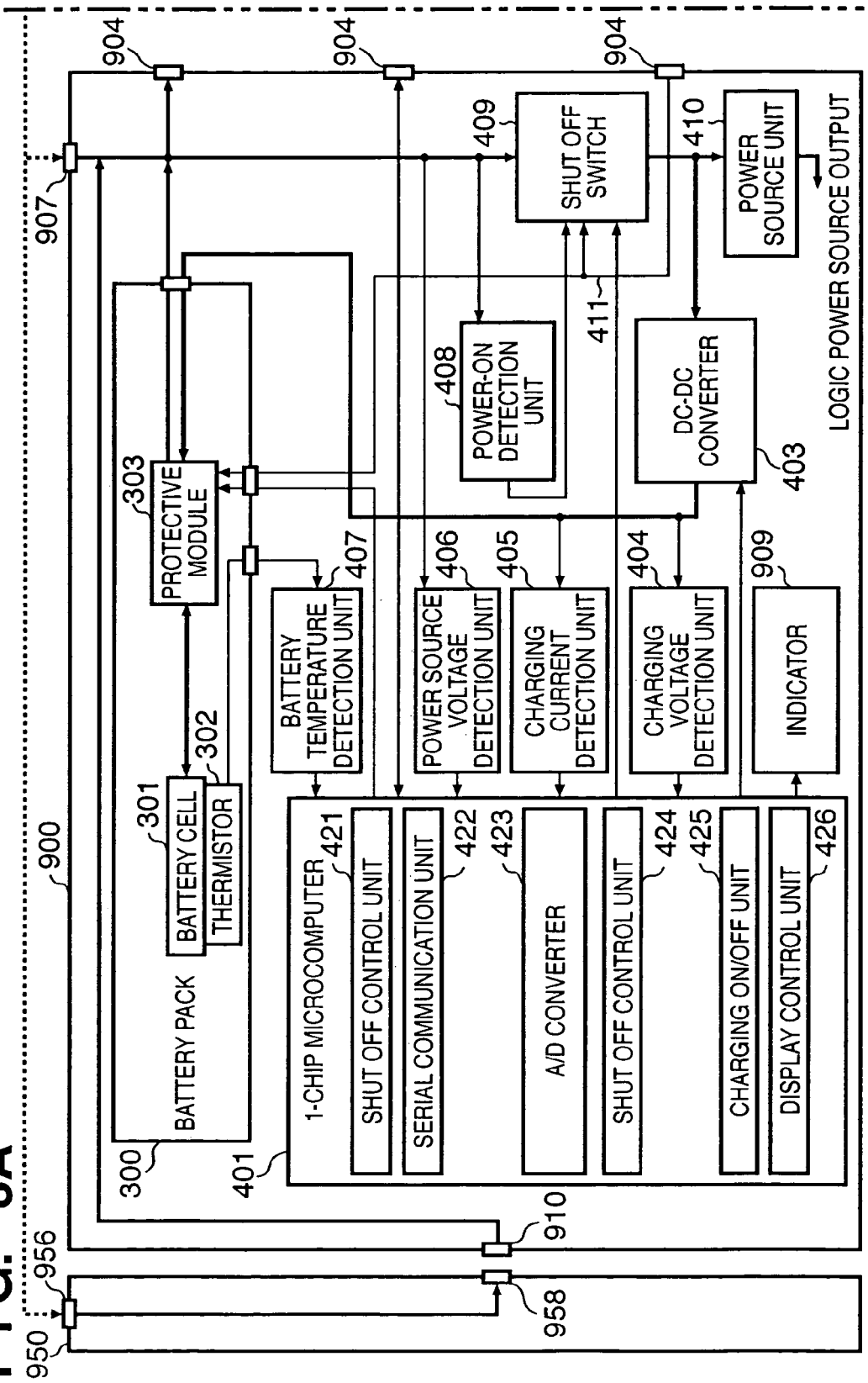

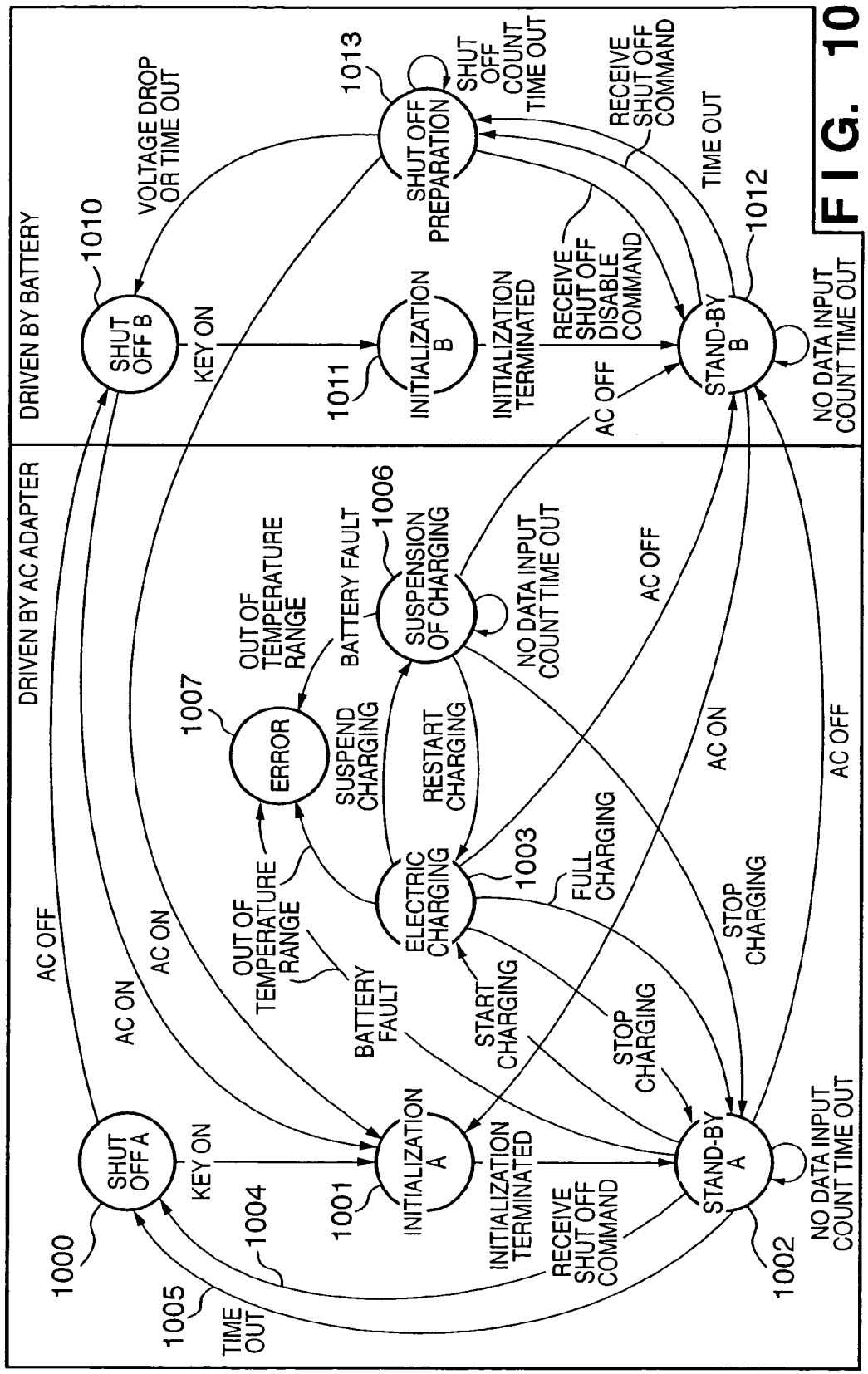

ELECTRIC CHARGING APPARATUS, ELECTRONIC APPARATUS, RESIDUAL BATTERY CAPACITY DETECTION METHOD AND BATTERY RESIDUAL CAPACITY DISPLAY CONTROL METHOD

FIELD OF THE INVENTION

The present invention relates to an electric charging apparatus to electrically charge a secondary battery, an electronic apparatus which can be driven with the secondary battery, a battery residual capacity detection method and a battery residual capacity display control method.

BACKGROUND OF THE INVENTION

Conventionally, in a battery-driven electronic apparatus, a user is informed of a battery residual capacity (electric power) by battery indication so that the user can easily determine time to electrically charge the battery.

As methods for battery residual capacity detection, a current integration method using a specialized IC to integrate charging/discharging battery current and calculate a residual capacity, a voltage detection method of estimating a residual capacity based on the result of detection of battery voltage utilizing the characteristic of discharging voltage which is gradually reduced accompanying the reduction of residual capacity and the like are known. For example, the former method is adopted in notebook type PCs and cam coders, while the latter method is adopted in digital cameras and cellular phones. The latter voltage detection method is disadvantageous in detection accuracy in comparison with the former current integration method, however, in the latter method, as the number of parts is smaller, the latter method is advantageous in cost and size. According to the voltage detection method, an output voltage from a battery is converted by an analog-digital converter to a digital signal, and the digital value is compared with a predetermined threshold value, thereby the residual capacity of the battery is determined. The result of determination is displayed on a battery indicator such as a liquid crystal display or LED for a user.

For example, in the case of notebook type PC including, as its driving power source, an AC adapter and a battery, as standard equipments, a battery charging circuit and a battery indicator are generally included in the notebook type PC main body. However, in the case of small image printing apparatus such as an ink jet printer, generally, only an AC adapter is included as a standard equipment but a battery, which is a second driving power source, is an optional equipment. In a case where a battery charging circuit and a battery indicator, which are necessary only upon use of the optional battery, are installed in the printing apparatus main body as in the case of the notebook type PC, unnecessary cost increase and upsizing are imposed on a user who does not require a battery. Accordingly, in some cases, the battery charging circuit is provided as a separate unit from the printing apparatus main body, and is handled as an optional equipment similar to the battery.

However, even in this case, as the battery indicator is provided in the printing apparatus main body, the unnecessary cost increase and upsizing are still imposed on a user who does not require a battery. Such load on the user is caused mainly by adoption of battery residual capacity detection based on the voltage detection method which can be realized at the lowest cost without size increase. The adoption of the voltage detection method has the merit as described above, and has almost no demerit of cost increase and upsizing even though the battery residual capacity detection method is implemented in the apparatus main body. However, this method has a technical limitation that if driving load on the apparatus upon battery voltage detection is not constant, a proper battery residual capacity cannot be detected.

Since the driving load on the printing apparatus is not always constant, it is necessary to detect the battery voltage when the driving load is constant so as to determine the battery residual capacity. However, as the timing of detection cannot be found from the outside of the printing apparatus main body, the battery residual-capacity detection function is provided in the printing apparatus main body, and the battery indicator is also provided in the apparatus main body. As for a printing apparatus driven by a battery or commercial power supply, in order to suppress the cost increase and upsizing of the printing apparatus main body due to the existence of the battery indicator included in a battery pack, it may be arranged such that a battery residual-capacity management module based on the current integration method comprising a microcomputer specialized for battery residual capacity management is provided in the battery pack. However, this imposes serial cost increase and upsizing of the battery pack on a user who does not require a battery.

SUMMARY OF THE INVENTION

The present invention has been made in consideration of the above conventional art, and provides an electric charging apparatus and an electronic apparatus where the residual capacity (electric power) of secondary battery can be easily checked with minimized cost increase and upsizing of the electric charging apparatus, a battery residual capacity detection method and a battery residual capacity detection control method.

According to the present invention, there is provided an electric charging apparatus including a secondary battery, attachable/removable to/from an electronic apparatus main body which can be driven with the secondary battery, the electric charging apparatus comprising, reception means for receiving residual capacity information of the secondary battery, detected by the electronic apparatus, from the electronic apparatus; and display control means for displaying a battery residual capacity based on the residual capacity information received by the reception means.

According to the present invention, there is provided an electronic apparatus, which an electric charging unit including a secondary battery is attachable/removable to/from, and which can be driven with electric power from the secondary battery, comprising: residual capacity detection means for detecting a residual capacity of the secondary battery at predetermined timing when the electric charging unit is attached to the electronic apparatus; and residual capacity transmission means for transmitting residual capacity information detected by the residual capacity detection means to the electric charging unit, wherein the predetermined timing is a status where the secondary battery is under an approximately constant electrical load.

Other features and advantages of the present invention will be apparent from the following description taken in conjunction with the accompanying drawings, in which like reference characters designate the same name or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 8A and 8B are block diagrams showing constructions of the ink jet printer, the battery charger and the cradle according to the embodiment;

FIG. 10 is a state transition diagram showing states between the ink jet printer and the battery charger according to the embodiment;

DESCRIPTION OF THE PREFERRED EMBODIMENT

A preferred embodiment of the present invention will now be described in detail in accordance with the accompanying drawings.

Figure 1:
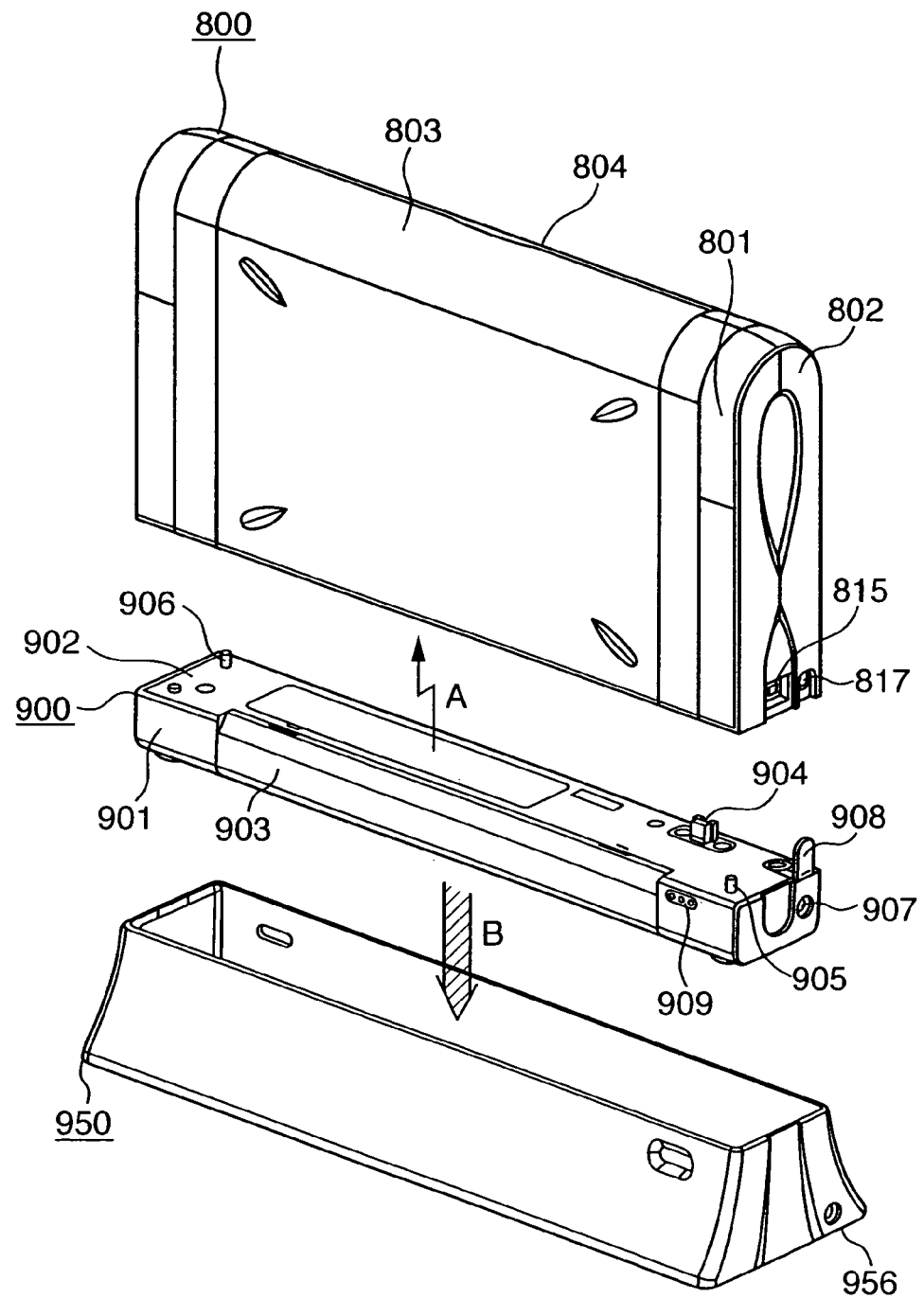
FIG. 1 depicts a perspective view showing the entire structure according to an embodiment of the present invention including an ink jet printer, a battery charger and a cradle.

FIG. 1 depicts a perspective view showing the entire structure of an image forming apparatus according to an embodiment of the present invention. In the present embodiment, FIG. 1 shows an ink jet printer 800, a battery charger 900 including a battery, which is removably attachable to the main body of the ink jet printer 800, and a cradle 950 accommodating the ink jet printer 800 to which the battery charger 900 is attached, in an upright position. Note that as a print medium for printing by the ink jet printer 800 of the present embodiment, a print sheet is used, however, the present invention is not limited to the print sheet but any sheet type medium may be employed as the print medium. Further, the image forming apparatus is not limited to the ink jet printer but is applicable to any other printer of different printing method such as a thermal printer or a liquid crystal printer, a display device or the like.

In FIG. 1, the ink jet printer 800 has an integral shell structure including an upper case 801, a lower case 802, a paper feed cover 803 and a paper discharge cover 804, and when it is not used as a printer (when it is installed or when a user carries it), it has an outer appearance as shown in FIG. 1. A DCin jack 817 (direct-current power source input jack) in which an AC adapter cable as a power source is inserted, and an I/F connector (interface connector) 815 for connection with a USB cable are provided on a side surface of the ink jet printer 800. The paper feed cover 803 is opened to the printer main body upon printing, and functions as a print-sheet supply tray holding print sheets such as paper.

Next, the battery charger (electric charging unit) 900 will be described. The battery charger 900 has a main case 901, a cover case 902 and a battery cover 903. When the battery cover 903 is removed and the main case 901 is opened, a battery pack (battery) as a charging battery can be removed.

Further, a main body connector 904 for electrical connection and fixing screws 905 and 906 for mechanical attachment are provided on an attachment surface (connection surface) of the battery charger 900 for connection with the ink jet printer 800. The battery charger 900 is connected to the main body of the printer 800 in an arrow A direction in FIG. 1, then the ink jet printer 800 can be battery-driven. Further, a charge indicator 909 indicating a battery charge state is provided on a top plate of the battery charger 900, and a CHG-DCin jack 907 in which an AC adapter cable as a power source is inserted and a blinder plate 908 which covers the DCin jack 817 of the ink jet printer 800 when the battery charger 900 is attached to the printer 800.

In a status where the ink jet printer 800, to which the battery charger 900 is attached, is inserted in an arrow B direction in FIG. 1 in the cradle 950, the cradle 950 functions as a base, and holds the ink jet printer 800 in an upright position as shown in FIG. 1.

Figure 2:
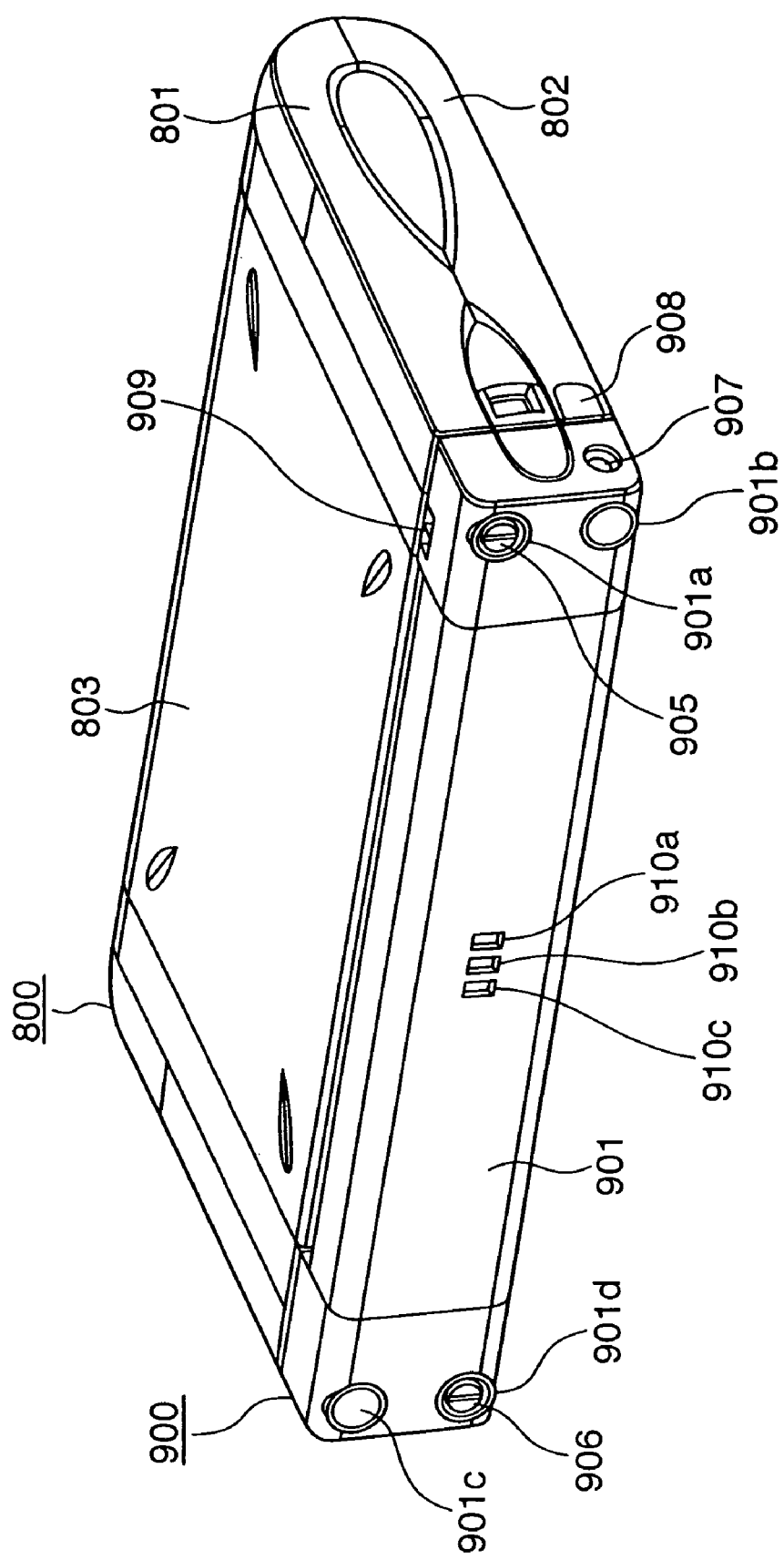
FIG. 2 depicts a perspective view of the ink jet printer in FIG. 1 to which the battery charger is attached.

FIG. 2 depicts a perspective view of the ink jet printer 800 to which the battery charger 900 is attached, viewed from a position in the rear of the printer and diagonally below the printer bottom plate side.

As shown in FIG. 2, when the battery charger 900 is attached to the rear surface of the ink jet printer 800 and fixed there with the fixing screws 905 and 906, the printer is battery-driven.

Further, as described above, the DCin jack 817 provided on the main body of the ink jet printer 800 is covered with the blinder plate 908 provided on the battery charger 900. When the battery charger 900 is attached to the ink jet printer 800, a user can rightly insert a power supply cable from the AC adapter into the CHG-DCin jack 907 of the battery charger 900, thus erroneous insertion of the power supply cable can be prevented.

Further, 4 legs 901a to 901d provided on the main case 901 are provided on the bottom surface of the battery charger 900. Further, contacts 910a to 910c for electrical contact with the cradle 910 upon attachment of the battery charger thereto are provided on the bottom surface of the battery charger 900.

Further, as shown in FIG. 2, the charge indicator 909 of the battery charger 900 is provided in a position in a top plate such that the user can easily check the indicator upon attachment or use of the ink jet printer 800, and can perform visual observation without being blocked when the paper feed cover 803 is open.

Figure 3:
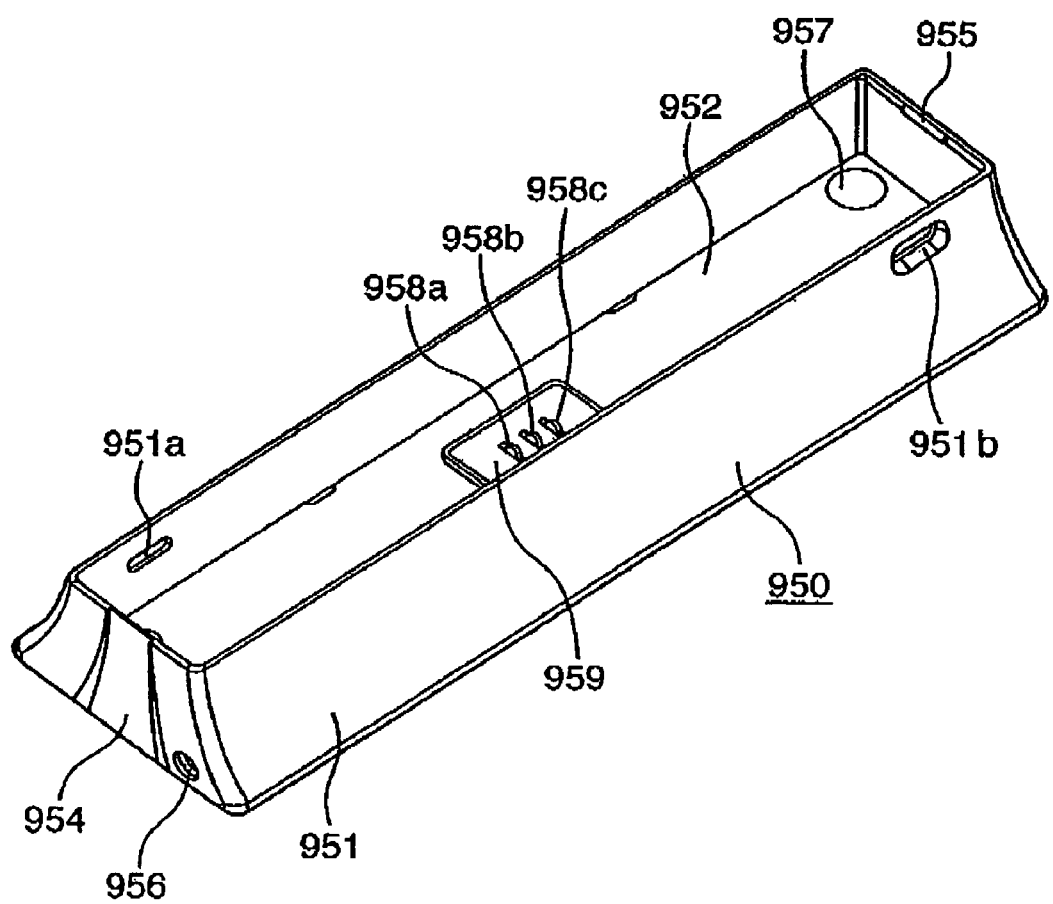
FIG. 3 depicts a perspective view showing the cradle accommodating the ink jet printer and the battery charger in FIG. 1.

FIG. 3 depicts a perspective view showing the structure of the cradle 950.

In FIG. 3, as the outer appearance of the cradle 950, the cradle has an upper case 951, a floor member 952, a bottom case (not shown in FIG. 3) and CDL decorative sheets 954 and 955. A CDL-DCin jack 956 in which an AC adapter cable as a power source is inserted, and windows 951a and 951b, for visual observation of the charge indicator 909 of the battery charger 900 even when the printer 800 is accommodated in the cradle 959, are provided on an outer side surface of the upper case 951. The windows 951a and 951b are provided diagonally to each other such that the charge indicator 909 of the battery charger 900 can be visually observed in whatever direction the ink jet printer 800, to which the battery charger 900 is attached, is accommodated in the cradle 950.

Further, CDL rubber legs 957 (3 of them are not shown in FIG. 3) are provided on the floor member 952 inside the cradle 950 to support the legs 901a to 901d of the battery charger 900 upon accommodation of the ink jet printer 800, to which the battery charger 900 is attached, in the cradle 950, in positions corresponding to the legs 901a to 901d. Further, contact terminals 958a to 958c for electrical contact with the contacts 910a to 910c of the battery charger 900, and a shutter member 959 for protection of the contact terminals 958a to 958c are provided inside the cradle 950. In normal times, the shutter member 959 is elevated to a position to cover ends of the contact terminals 958a to 958c, and when the ink jet printer 800 to which the battery charger 900 is attached is accommodated in the cradle 950, the shutter member 959 is moved downward to a position such that the ends of the contact terminals 958a to 958c are exposed (in FIG. 3, the terminal are exposed), and the contact terminals 958a to 958c are electrically connected to the contacts 910a to 910c of the battery charger 900. Note that the number of the contacts of the battery charger 900 and the number of the contact terminals of the cradle 950 for connection with the contacts are not limited to the above numbers of the present embodiment.

Further, as shown in FIG. 3, the contacts 910a to 910c of the battery charger 900 and the contact terminals 958a to 958c of the cradle 950 are respectively provided in central portions of connection surfaces of the battery charger 900 and the cradle 950. The contacts 910a to 910c and the contact terminals 958a to 958c, respectively in proper arrangement, are in symmetrical positional relation for electrical connection when the battery charger 900 is accommodated in front-facing/backward-looking state in the cradle 950. Further, the windows 951a and 951b of the upper case 951 corresponding to the charge indicator 909 of the battery charger 900 are diagonally positioned to each other. Accordingly, when the user accommodates the ink jet printer 800 to which the battery charger 900 is attached into the cradle 950, regardless of in front-facing or backward-looking state, attachment and electric charging can be made without functional inconvenience.

Figure 4A:
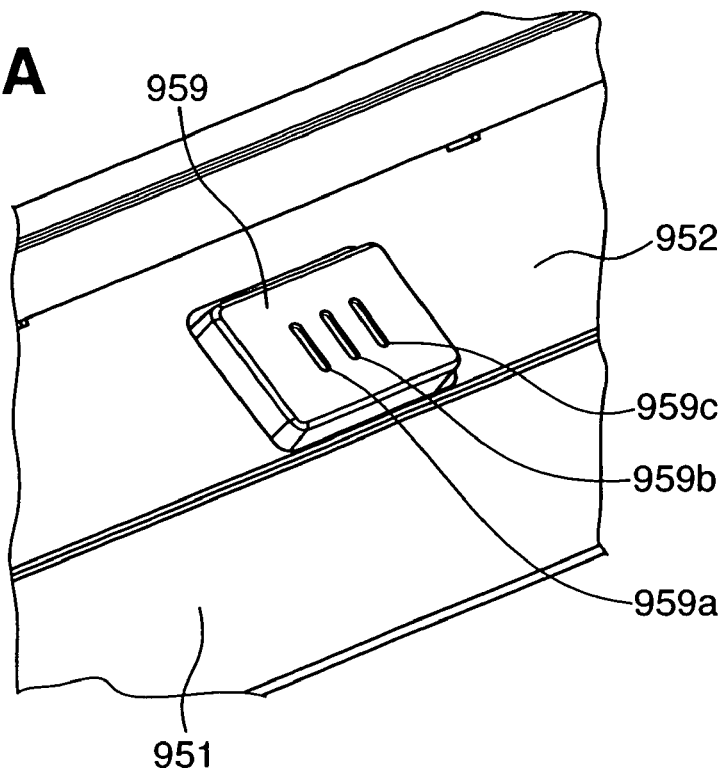
FIGS. 4A and 4B depict expanded perspective views explaining an operation of a shutter member of the cradle.
Figure 4B:
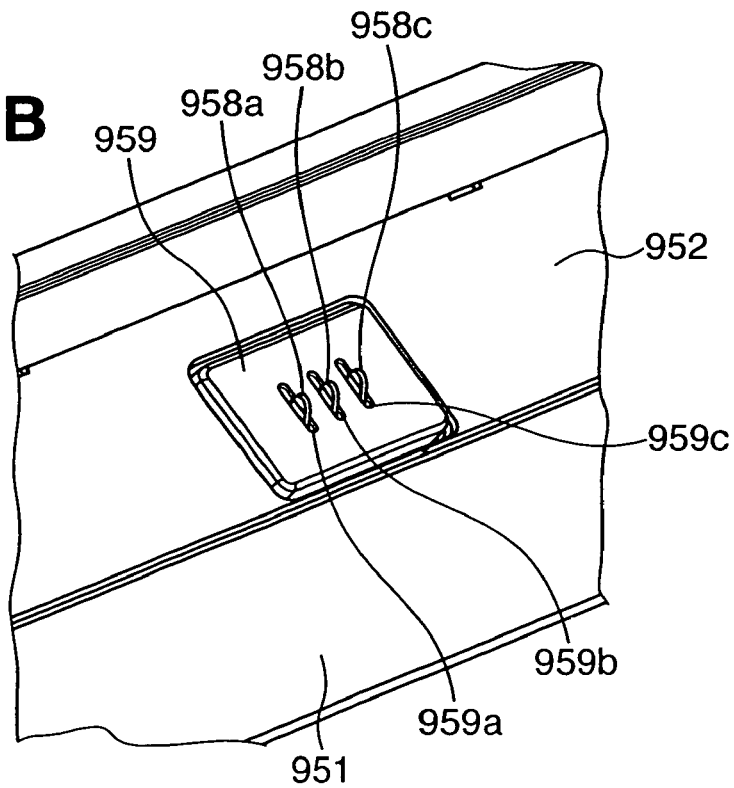

FIGS. 4A and 4B depict expanded perspective views explaining the operation of the shutter member 959 of the cradle 950. FIG. 4A shows a status where the shutter member 959 is in the elevated position, and FIG. 4B, a status where the shutter member 959 is in the lower position.

As shown in FIG. 4A, in the status where nothing is accommodated in the cradle 950, the shutter member 959 is elevated to a position to completely cover the contact terminals 958a to 958c, thereby prevents breakage of the contact terminals. On the other hand, when the ink jet printer 800 is accommodated in the cradle 950, the shutter member 959 is moved down to the position as shown in FIG. 4B, such that the contact terminals 958a to 958c are exposed from slits 959a to 959c provided in the shutter member 959, for electrical connection with the contacts 910a to 910c.

Further, a biasing force to elevate the shutter member 959 is set to a smaller value than the weight of the ink jet printer 800 as a matter of course and smaller than that of the battery charger 900. Accordingly, even in a case where only the battery charger 900 is accommodated in the cradle 950, electrical connection can be made between the contacts 910a to 910c and the contact terminals 958a to 958c.

Figure 5:
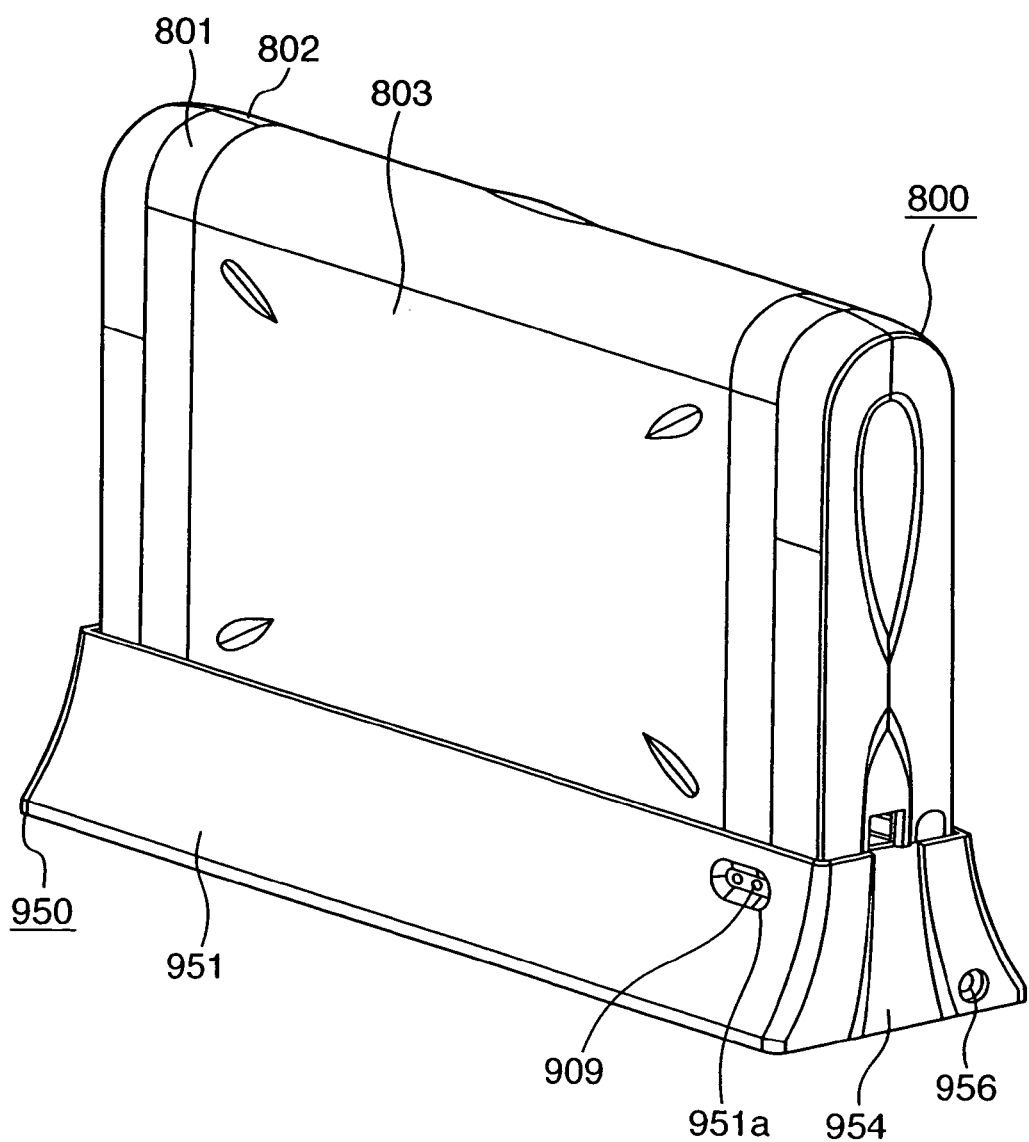
FIG. 5 depicts a perspective view of the cradle accommodating the ink jet printer to which the battery charger is attached.

FIG. 5 depicts a perspective view of the cradle 950 accommodating the ink jet printer 800 to which the battery charger 900 is attached. In FIG. 5, elements corresponding to those in the above-described figures have the same reference numerals, and explanations thereof will be omitted.

In FIG. 5, as the contacts 910a-910c of the battery charger 900 are electrically connected to the contact terminals 958a-958c of the cradle 950, the battery pack (battery) included in the battery charger 900 is electrically charged by inserting the AC adapter cable into the CDL-DCin jack 956 of the cradle 950.

As shown in FIG. 5, in the status where the ink jet printer 800 to which the battery charger 900 is attached is accommodated in the cradle 950, the CHG-DCin jack 907 of the battery charger 900 is covered with the upper case 951. Upon use of the cradle 950, the user can rightly insert the AC adapter cable into the CDL-DCin jack 956 of the cradle 950, thereby erroneous insertion of a power supply cable can be prevented.

Further, as the charge indicator 909 of the battery charger 900 can be visually observed via the window 951a provided in the upper case 951 of the cradle 950, the battery charge status can be checked while the battery charger 900 is accommodated in the cradle 950.

Figure 6:
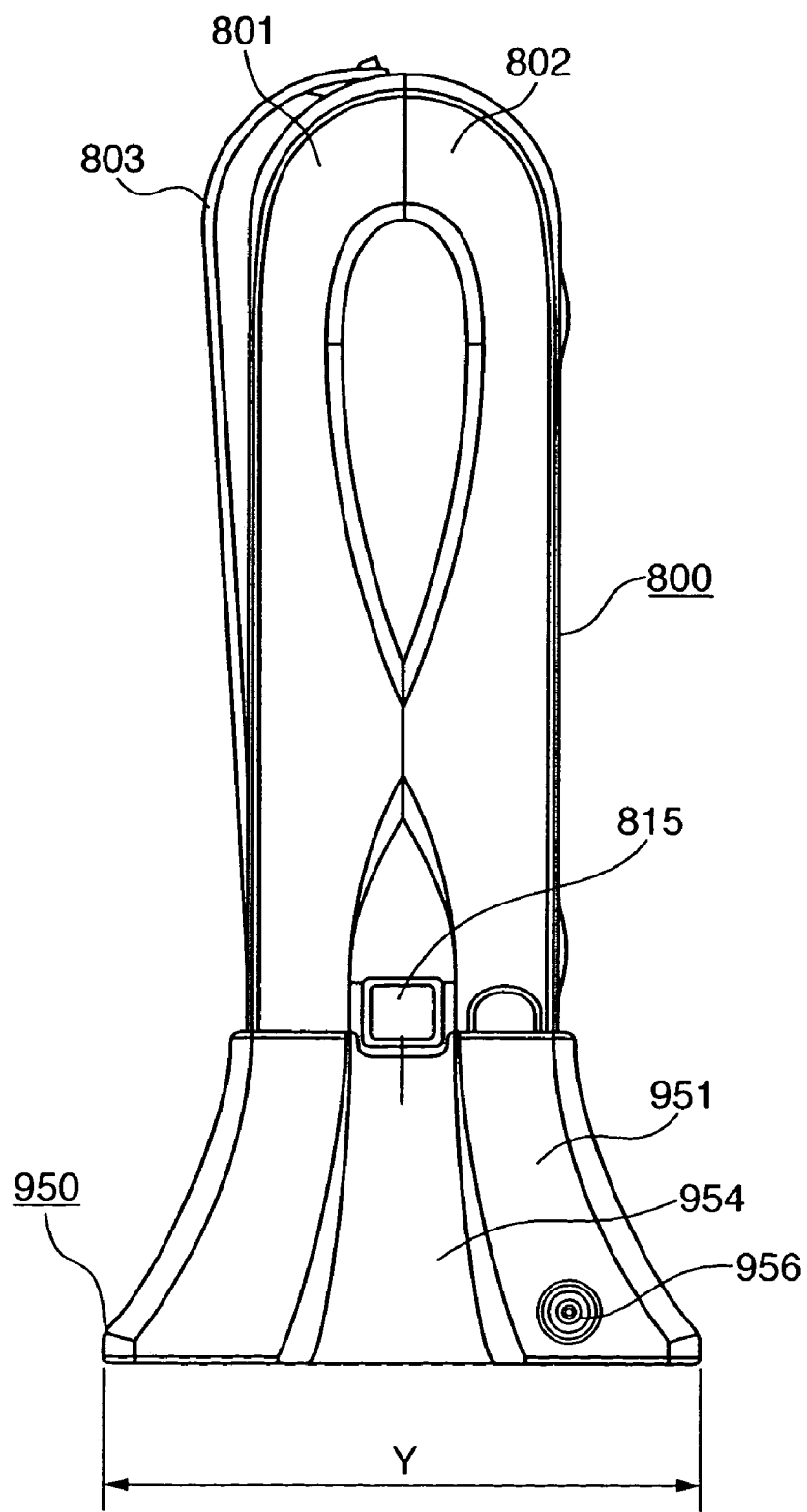
FIG. 6 depicts a side view of the cradle in FIG. 5.

FIG. 6 depicts a side view of the cradle 950 in FIG. 5 accommodating the ink jet printer 800 to which the battery charger 900 is attached.

As shown in FIG. 6, in the status where the ink jet printer 800 is accommodated in the cradle 950, the printer 800 is supported with the paper feed cover 803 in an un-opened position. That is, when the ink jet printer 800 is accommodated in the cradle 950, the paper feed cover 803 is placed inside the upper case 951, thereby an opening operation of the paper feed cover 803 is regulated. Accordingly, erroneous opening or dropout of the paper feed cover 803 during battery charging or the like can be prevented.

Further, in FIG. 6, the upper case 951 and the CDL decorative sheet 954 are provided such that the I/F connector 815 of the ink jet printer 800 is completely exposed while the ink jet printer is accommodated in the cradle 950. Accordingly, even when the ink jet printer 800, in which the USB cable is inserted, is accommodated in the cradle 950, there is no interference between the cradle 950 and the cable. It is not necessary to remove the USB cable every time the ink jet printer 800 is accommodated in the cradle 950, and there is no damage to the connector portion upon such attachment/removable. Further, the ink jet printer 800 may be provided with radio communication means utilizing light or radio wave in a portion exposed from the cradle 950 when the ink jet printer 800 is accommodated in the cradle 950.

Further, as shown in FIG. 6, the cradle 950 has a shape that, as the relation between a width X of an opening to accommodate the ink jet printer 800 (i.e., the width of installation surface of the ink jet printer 800 in an upright position) and a width Y of installation surface of the cradle 950 to the floor, X<Y holds. Accordingly, in comparison with a case where the ink jet printer 800 is placed in an upright position as a single device, safety is much more increased in the case where the printer 800 in an upright position is accommodated in the cradle 950. It is not necessary to carefully operate the printer 800 as in the case that the printer 800 is placed in an upright position as a single device or to set leg members to increase the installation area for safety, and it is easy to accommodate/remove the printer 800 in/from the cradle.

In the above description, the ink jet printer, to which the battery-including removable charging unit is attached, is accommodated in the cradle only with the electrical connection function, thereby the battery is electrically charged, however, the present invention is not limited to this arrangement.

Next, the construction of mechanisms of the ink jet printer 800 according to the present embodiment will be described with reference to FIG. 7.

Figure 7:
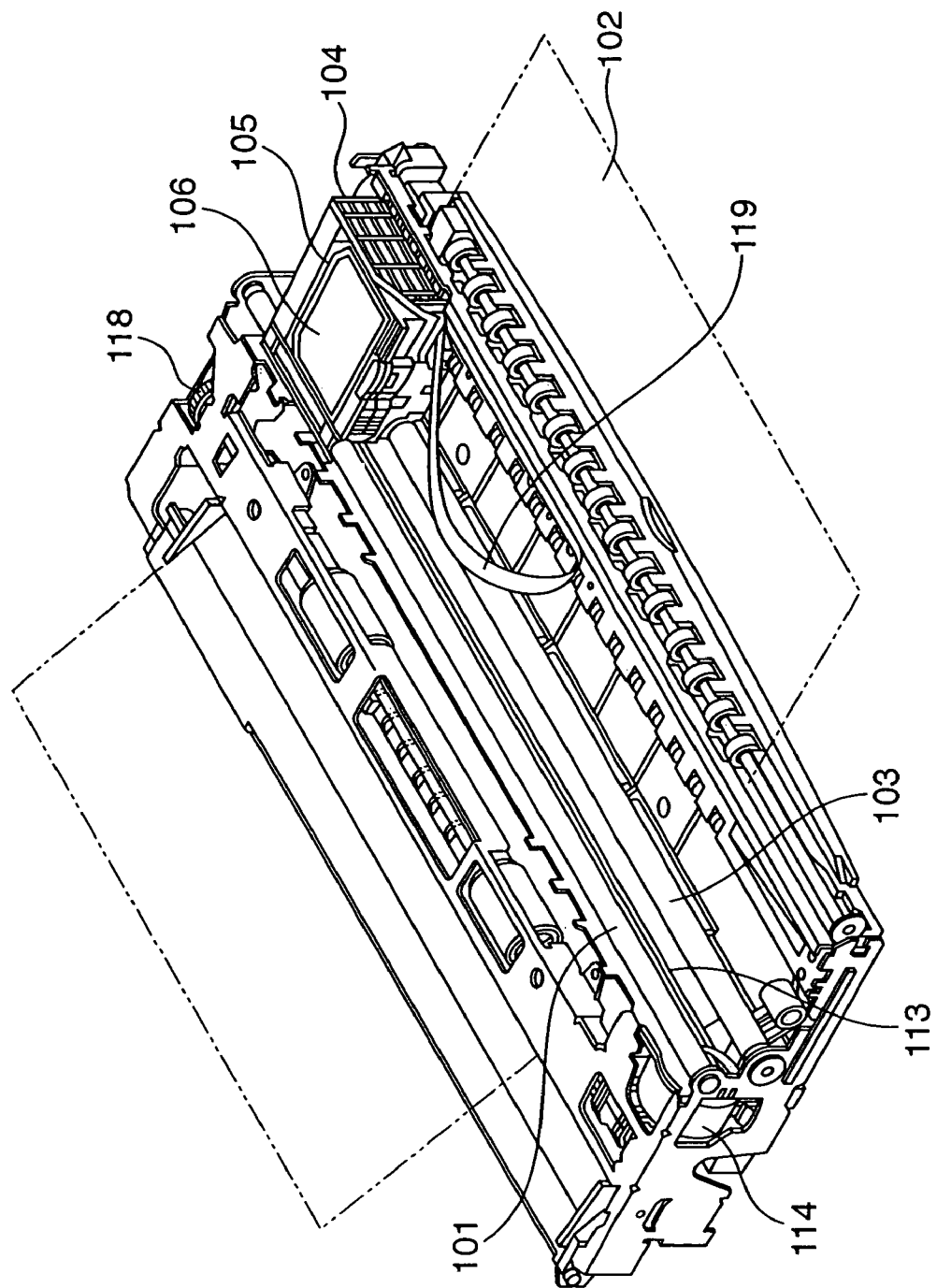
FIG. 7 depicts a perspective view showing mechanisms of the ink jet printer according to the embodiment.

FIG. 7 depicts a perspective view showing the mechanisms of the ink jet printer 800 according to the present embodiment.

In FIG. 7, a print head cartridge 105, comprising integrated print head and ink tank 106, is mounted on a carriage 104, and is reciprocated in a lengthwise direction along a guide rail 103. Ink discharged from the print head is attached to a print medium (print sheet) 102 where its printing surface is regulated on a platen via a slight interval from the print head, and forms an image on the print sheet.

The print head is supplied with a discharge signal in correspondence with image data via a flexible cable 119. Note that numeral 114 denotes a carriage motor to scan-move the carriage 104 along the guide rail 103. Numeral 113 denotes a carriage driving belt to transmit a driving force of the carriage motor 114 to the carriage 104. Further, numeral 118 denotes a conveyance motor for rotating a conveyance roller 101 to convey the print sheet 102.

Next, the ink jet printer 800, the battery charger 900 and the cradle 950 will be respectively described in detail with reference to FIGS. 8A and 8B.

Figure 8B:
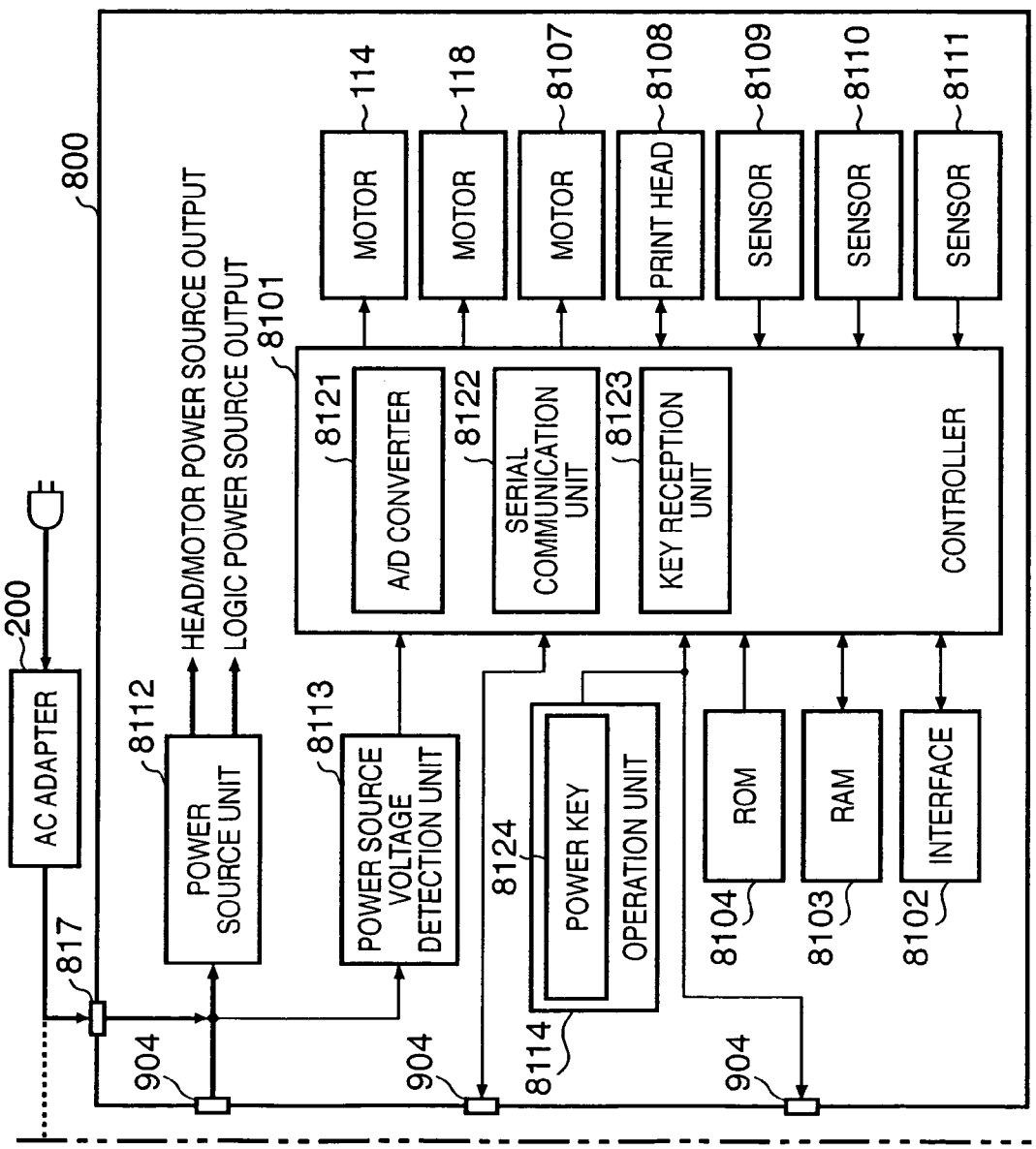

FIGS. 8A and 8B are block diagrams showing the constructions of the ink jet printer 800, the battery charger 900 and the cradle 950 according to the present embodiment. Note that in FIGS. 8A and 8B, elements corresponding to those in the above-described figures have the same reference numerals, and explanations thereof will be omitted.

In FIGS. 8A and 8B, the ink jet printer 800 has the following construction.

A controller 8101 performs various controls such as print data supply control to supply print data to a print head 8108, data transfer control to transfer data between an interface 8102 to input a print signal from an external device and a RAM 8103, and driving of the carriage motor 114 and the conveyance motor 118 upon print operation. The controller 8101 has a CPU (not shown) which performs various controls to be described later in accordance with a control program stored in a ROM 8104, an analog-digital (A/D) converter 8121 which converts an analog signal from a power source voltage detection unit 8113 to a digital signal, a serial communication unit 8122 for communication with the battery charger 900 to be described later, a key signal reception unit 8123 which inputs a key switch signal from operation at an operation unit 8114, and the like. The ROM 8104 holds the control program executed by the controller 8101, various data and the like. The RAM 8103, which is also used as a work area, holds various data. A purge motor 8107 drives cleaning means of the print head 8108. A power key switch 8124 is provided on the operation unit 8114. Note that the operation unit 8114 has various key switches, display lamps, liquid crystal display and the like. A power source unit 8112 generates electric power for the print head 8108 and the various motors 114, 118 and 8107, and electric power to drive a logic circuit, a driving circuit and the like of the controller 8101. The power source voltage detection unit 8113 detects a voltage of the driving power source supplied to the ink jet printer 800 and outputs it to the A/D converter 8121.

Further, an AC adapter 200, which inputs commercial electric power (AC electric power) and generates a predetermined DC voltage, functions as a primary driving power source of the ink jet printer 800.

In the above construction, when the power key 8124 at the operation unit 8114 is depressed and the power source of the ink jet printer 800 is turned on, an operation of the ink jet printer 800 starts, and enters in a stand-by status waiting for reception of print signal from a host device as an external device. When a print signal has been transmitted from the host device and inputted into the interface 8102, the controller 8101 converts the print signal into print data for printing. Then the controller 8101 rotate-drives the respective motors 114, 118 and 8107, and at the same time, drives the print head 8108 in accordance with the print data, thereby performs image printing.

Further, in a case where the battery charger 900 is connected to the ink jet printer 800 and the printer 800 operates with electric power supplied from the battery, the controller 8101 detects an output from the power source voltage detection unit 8113 using its internal A/D converter 8121 at predetermined timing, so as to detect a residual capacity (electric power) of the battery as a secondary driving power source. Further, the controller 8101 transmits information on the detected battery residual capacity (electric power) to the battery charger 900 via the serial communication unit 8122.

Figure 9A:
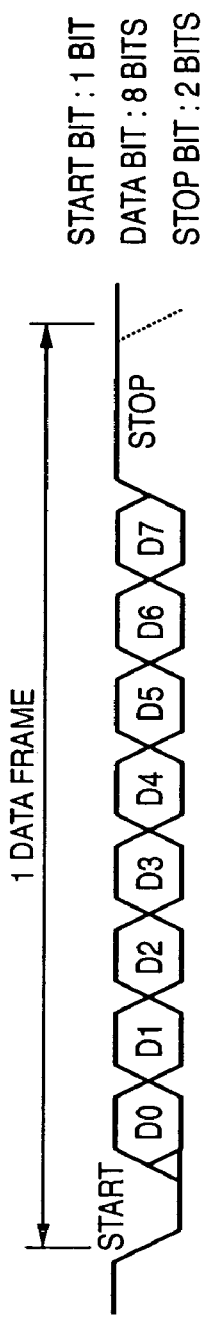
FIGS. 9A and 9B depict explanatory views showing data format in serial data communication between the ink jet printer and the battery charger according to the embodiment.
Figure 9B:
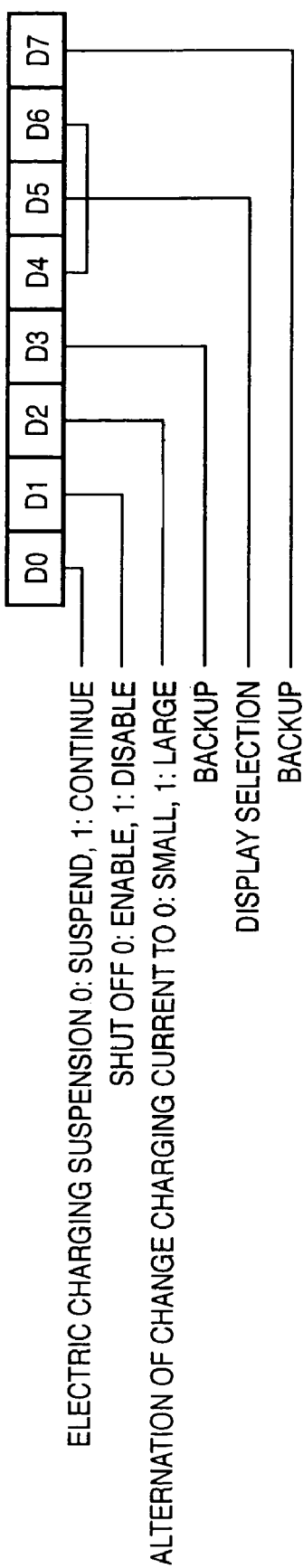

FIGS. 9A and 9B depict explanatory views showing data format in serial data communication between the ink jet printer 800 and the battery charger 900 according to the embodiment. FIG. 9A shows a 1-byte data transfer frame, and FIG. 9B shows an allocation of respective bits.

As shown in FIG. 9A, the serial data has a 1 data frame of total 11 bits including a 1-bit start bit, following 8 data bits, and 2 stop bits.

As shown in FIG. 9B, a bit designating whether or not to suspend battery charging (D0), a bit designating whether or not to enable a transition to a shut off state (D1), a bit designating alternation of charging current (D2), bits designating display content on the display 909 of the battery charger 900 in correspondence with the residual capacity (electric power) of the battery pack 300 (D4 to D6) and the like are allocated to the data bits. Note that the ink jet printer 800 transmits the data frame to the battery charger 900 via the serial communication unit 8122 at predetermined time intervals.

Next, the construction of the battery charger 900 will be described with reference to FIGS. 8A and 8B.

The battery pack 300 is used as a secondary driving power source of the ink jet printer 800. In the present embodiment, the battery pack 300 is a lithium ion battery, however, the present invention is not limited to this battery. Numeral 301 denotes a battery cell; numeral 302 denotes a thermistor used for measurement of the temperature in the battery pack; and numeral 303 denotes a protective module which protects the battery cell 201 from overvoltage, overcurrent and overdischarge.

The battery charger 900, in a status where the CHG-DCin jack 907 is supplied with electric power from the AC adapter 200, has a power source relay function to relay-output a higher one of output voltages from the AC adapter 200 and the battery pack 300 to the ink jet printer 800, a charging function to electrically charge the battery pack 300 with the DC output from the AC adapter 200, a power save function to shut off its internal circuits and the power source output from the battery pack 300 to save power, and a communication function to perform serial communication with the ink jet printer 800.

A 1-chip microcomputer 401 includes a memory holding a control program for this microcomputer, and controls the entire operation of the battery charger 900. The microcomputer 401 mainly includes, as its control functional units, an A/D converter 423, a charging on/off unit 425, a display control unit 426, a shut off control unit 421, and a serial communication unit 422. A DC-DC converter 403 generates a charging voltage to electrically charge the battery pack 300 from the electric power supplied from the AC adapter 200. A shut off switch 409 performs power source shut off control to cut electric consumption in the battery charger 900. The shut off switch 409 is constructed by using e.g., FET transistors. A power source unit 410 is a voltage regulator which generates a driving voltage for a logic circuit of the battery charger 900. A power-on detection unit 408 releases a shut off state of the shut off switch 409 when the unit 408 detects that the output from the AC adapter 200 is connected to the jack 907 and electric power supply from the AC adapter 200 is started. A power key signal 411 is generated in correspondence with depression of the power key 8124 of the ink jet printer 800. When the signal 411 is inputted, a power save status of the battery charger 900 is released. The indicator 909 indicates the battery residual capacity (electric power) for the user. A charging voltage detection unit 404 detects a battery voltage during electric charging. A charging current detection unit 405 detects a charging current. A power source voltage detection unit 406 detects a voltage of the driving power source. A battery temperature detection unit 407 converts a resistance value of the thermistor 302 to a voltage value to detect the temperature of the battery pack 300.

Further, when the output from the AC adapter 200 is connected to the DCin jack 956 of the cradle 950, the electric power is supplied through the above-described contact terminals 958 (958a to 958c) to the terminals 910 (910a to 910c) of the battery charger 900.

In the above construction, an operation procedure upon driving with electric power from the AC adapter 200 and an operation procedure upon driving with electric power from the battery pack 300 will be described with reference to the state transition diagram of FIG. 10. In FIG. 10, AC ON shows a state in which the AC adapter 200 is connected (a jack of the AC adapter 200 is connected), and AC OFF shows a state in which the AC adapter 200 is not connected (the jack of the AC adapter 200 is removed), and Key On shows an ON state of the power switch.

In a case where the output from the AC adapter 200 is connected to the jack 907 of the battery charger 900 or the output from the AC adapter 200 is already connected and the charger 900 is in a shut off A state 1000, when the power key 8124 of the ink jet printer 800 is depressed, the shut off state of the shut off switch 409 is released by the power-on detection unit 408 or the power key signal 411, then an electric power is supplied to the internal circuits of the ink jet printer 800 and the battery charger 900, and the 1-chip microcomputer 401 starts to operate. The 1-chip microcomputer 401 performs initialization A processing 1001 for, e.g., holding the shut off released state of the shut off switch 409 and release of a battery shut off switch of the protective module 303 in the battery pack 300 from a shut off state, and moves to a stand-by A state 1002, in accordance with the control program stored in its memory.

In the stand-by A state 1002, it is determined whether or not the battery pack 300 requires electric charging. If the electric charging is necessary, the process proceeds to an electric charging state 1003. Further, if the electric charging is not necessary since e.g. the battery pack 300 has already been fully charged, the stand-by A state 1002 is held. When a shut off instruction is made by the serial data from the ink jet printer 800 (1004) or a state where the serial data, periodically transmitted from the ink jet printer 800 when power-on, has not been received for a predetermined period (1005), the process proceeds to shut off A 1000 power save mode.

Further, in the electric charging state 1003, the 1-chip microcomputer 401 controls the DC-DC converter 403 based on the signals from the battery temperature detection unit 407, the power source voltage detection unit 406, the charging current detection unit 405 and the charging voltage detection unit 404, to electrically charge the battery pack 300. At this time, an indication of execution of electric charging is displayed on the indicator 909 for the user. Note that when an electric charging suspension instruction is made by the serial data from the ink jet printer 800, the process proceeds to an electric charging suspension state 1006, in which the electric charging of the battery pack 300 is temporary suspended. In the electric charging suspension state 1006, if an electric charging restart instruction has been sent from the ink jet printer 800 or the serial data from the ink jet printer 800 has not been received for a predetermined period, the process returns to the electric charging state 1003, in which the electric charging is restarted. When the battery pack 300 is electrically charged to a predetermined charging capacity (electric power), the process proceeds to the stand-by A state 1002. Further, in the electric charging state 1003, when it is determined that the charging voltage or the charging current cannot be detected due to abnormality of battery temperature or fault in the battery, based on the signals from the battery temperature detection unit 407, the power source voltage detection unit 406, the charging current detection unit 405 and the charging voltage detection unit 404, the 1-chip microcomputer 401 controls the DC-DC converter 403 to stop the electric charging of the battery pack 300, and the process proceeds to an error state 1007.

Next, an operation procedure upon driving with electric power from the battery pack 300 (battery driving) will be described.

In this case, the AC adapter 200 is not connected. First, in a shut off B state 1010 of a power save mode, when the power key 8124 of the ink jet printer 800 is depressed, the shut off state of the shut off switch 409 and that of the shut off switch in the battery protective module 303 are released by the power key signal 411, then an electric power is supplied to the internal circuits of the ink jet printer 800 and the battery charger 900, and the 1-chip microcomputer 401 starts to operate. The 1-chip microcomputer 401 performs initialization B processing 1011 for, e.g., holding the shut off released state of the shut off switch 409 and that of the shut off switch in the battery protective module 303, and moves to a stand-by B state 1012, in accordance with the control program stored in its memory. In the stand-by B state 1012, the 1-chip microcomputer 401 indicates the residual capacity (electric power) of the battery pack 300 on the indicator 909 in accordance with an instruction in the serial data from the ink jet printer 800. At this time, in the ink jet printer 800, the power source voltage supplied from the battery charger 900 is detected by the power source voltage detection unit 8113 for detection of the residual capacity (electric power) of the battery pack 300, and the result of detection is transmitted via the serial communication units 8122 and 422 to the battery charger 900. Then in the battery charger 900, the battery residual capacity (electric power) is displayed.

Further, in the ink jet printer 800, when a power-off instruction is made by the power key 8124, a shut off enable instruction is transmitted as the serial data to the battery charger 900. In the battery charger 900, the output from the battery pack 300 is shut off in a shut off preparation state 1013, and the shut off switch 409 is turned off. Then the battery charger 900 shifts to a shut off B state 1010. Thus, wasteful consumption of the battery pack 300 due to dark currents in the ink jet printer 800 and the battery charger 900 upon power-off time can be prevented.

Next, a description will be made about a case where the battery charger 900 which has been connected to the ink jet printer 800, is disconnected from the ink jet printer 800. In a case where the battery charger 900 is the shut off A state 1000 when the jack 907 is connected to an output terminal of the AC adapter 200, if the battery charger 900 is disconnected from the ink jet printer 800, the output terminal of the AC adapter 200 is removed from the jack 907 (AC OFF) and the battery charger 900 shifts to the shut off B state 1010. After then, when the output terminal of the AC adapter 200 is again connected to the jack 907 (AC ON), the battery charger 900 shifts to the initialization A state 1001. In the initialization A state 1001, the battery charger 900 has completed the initialization process and shift to the stand-by A state 1002 to wait for a command from the ink jet printer 800. In this case, the ink jet printer 800 is not connected, so the command is not transmitted from the printer 800. It is determined whether or not an electric charging of the battery pack 300 is necessary in the stand-by A state 1002, if necessary, the battery charger 900 shifts to the electric charging state 1003 and electrically charges the battery pack 300. Then, the charger 900 shifts to the stand-by A state 1002 after the electric charging is completed.

In the stand-by A state 1002, when the output terminal of the AC adapter 200 is removed from the jack 907 (AC OFF), the battery charger 900 shifts to the stand-by B state 1012. After then, when the output terminal of the AC adapter 200 is connected to the jack 907 (AC ON), the battery charger 900 shifts to the initialization A state 1001, and after then shifts to the stand-by A state 1002. As described above, according to the connection/non-connection of the AC adapter 200, the battery charger 900 shifts to the stand-by A state 1002 and performs the electric charging operation of the battery pack 300 by itself, without any instruction by depression of the power key 8124 (even if the battery charger 900 is not connected to the ink jet printer 800).

Next, a description will be made about a software control procedure for automatic selection between a print mode and an electric charging mode to electrically charge the rechargeable battery pack 300 in the ink jet printer 800 as described above.

Figure 11:
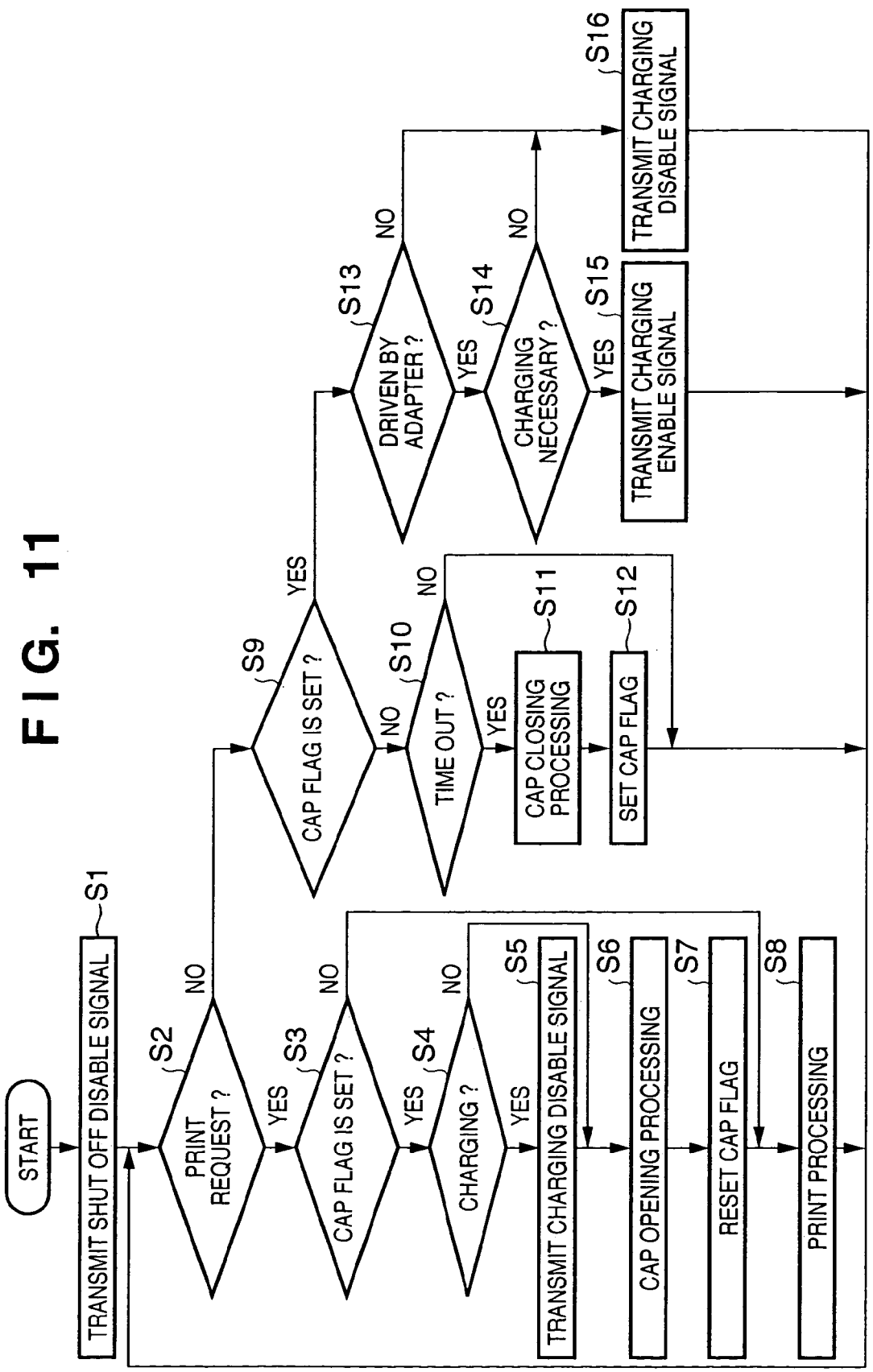
FIG. 11 is a flowchart showing processing in the ink jet printer according to the embodiment.

FIG. 11 is a flowchart showing an operation procedure in the ink jet printer 800 according to the present embodiment. A program for this processing is stored in the ROM 8104, and it is executed in accordance with control processing by the controller 8101.

The processing is started by depression of the power key 8124 of the operation unit 8114. When the power source is turned on, first, at step S1, a shut off disable signal to prohibit a transition to the shut off mode is transmitted via the serial communication unit 8122 to the battery charger 900. In the battery charger 900, a flag to permit a transition to the shut off mode is reset (tuned off) by receiving the shut off disable signal. This processing will be described later with reference to the flowchart of FIG. 16.

Next, at step S2, it is determined whether or not a print command has been inputted from the host device via the interface 8102. If it is determined that a print command has been received, the process proceeds to step S3, at which it is determined whether or not the current mode is a so-called stand-by mode in which a cap for prevention of dry and dust is attached to the print head 8108. Since the controller 8101 itself controls capping of the print head 8108, the determination is made based on an on/off state of a cap flag set in the RAM 8103. If it is determined that the cap flag is off, i.e., the print head is not capped (a capping processing is not implemented), the process proceeds to step S8, while if it is determined that the cap flag is on, i.e., the print head is capped (a capping processing is being implemented), the process proceeds to step S4. The cap flag is set ON, e.g., the capping operation is completed, and is set OFF when the capping releasing operation is completed (for recording operation).

At step S4, it is determined whether or not the battery pack 300 is being electrically charged in the battery charger 900. If it is determined the battery pack is being electrically charged, the process proceeds to step S5, at which a charging suspension signal indicating that electric charging is disabled (D0=0: FIG. 9B) is serially transmitted to the battery charger 900, to stop electric charging of the battery pack 300 and stop the indication of charging on the indicator 909. Then the process proceeds to step S6. Note that the determination whether or not the battery pack is being electrically charged may be made based on an instruction from the battery charger 900 by communication through the serial communication units 422 and 8122. Otherwise, it may be arranged such that a flag indicating that electric charging is enabled or disabled is set in the RAM 8103 and the determination is made based on the flag state.

On the other hand, if it is determined that the battery pack 300 is not being electrically charged, the process proceeds to step S6, at which the cap on the print head 8108 is opened. Then at step S7, the cap flag is reset. At step S8, print processing is performed in accordance with the print command from the host device. When the print processing has been completed, the process returns to step S2, to wait for reception of print command from the host device again.

If a print command has not been received at step S2, the process proceeds to step S9, at which it is determined whether or not the print head 8108 is capped based on the cap flag in the RAM 8103 as in the case of the above-described step S3. If it is determined that the cap flag is off, i.e., the print head 8108 is not capped, the process proceeds to step S10, at which time elapsed from the reception of the print command is measured. It is determined whether or not the time has exceeded a predetermined time period, i.e., a time out has occurred. If it is determined that a time out has not occurred, the process returns to step S2, while if it is determined that the time out has occurred, the process proceeds to step S11, at which the print head 8101 is capped for protection of print head. Then the process proceeds to step S12, at which the cap flag in the RAM 8103 is turned on. The processing from step S9 to step S12, which is called auto capping processing, is well-known processing for preventing clogging in the print head 8108 in non-printing times.

Further, if it is determined at step S9 that the print head 8108 is capped, the process proceeds to step S13, at which it is determined based on the signal from the power source voltage detection unit 8113 whether or not the printer 800 is driven with an electric power from the AC adapter 200. If it is determined that the printer 800 is driven with the electric power from the AC adapter 200, the process proceeds to step S14, at which it is determined based on a signal from the battery charger 900 whether or not electric charging of the battery pack 300 is necessary (for example, whether or not the battery pack 300 is full-charged). If it is determined that the electric charging is necessary, the process proceeds to step S15, at which the data indicating that the electric charging is enabled (D0=1: FIG. 9B) is transmitted to the battery charger 900, to start electric charging of the battery pack 300 and the indication of charging in the battery charger 900. That is, the present mode is changed to the electric charging mode, or the electric charging mode is continued. On the other hand, if it is determined that the electric charging is not necessary, the process proceeds to step S16, at which the data indicating suspension of electric charging (D0=0: FIG. 9B) is transmitted to the battery charger 900, to stop or suspend electric charging of the battery pack 300 and the indication of charging, and the process returns to step S2.

As will be described later, in the battery charger 900, it is determined whether or not the temperature of the battery cell 301 detected by the battery temperature detection unit 407 is normal, and whether or not the output voltage from the battery pack 300 detected by the charging voltage detection unit 407 is a value indicating that electric charging is necessary. Then based on the results of detection, notification as to whether or not electric charging is necessary is made as the above-described serial signal to the ink jet printer 800.

As described above, at steps S2 and S3 to S8, the electric charging processing is not performed since the print mode is executed. At steps S2 and S9 to S12, suspension or termination of the print mode is determined and the cap closing processing is performed. At steps S2, S9 and S13 to S16, processing of transition to the electric charging mode based on the cap flag is performed.

In step S9, if the cap flag is ON, the ink jet printer 800 may transmit a command for permitting an electric charging of the battery pack 300 to the battery charger 900 and the battery charger 900 may determine whether or not to perform the electric charging.

Note that in the ink jet printer 800, the data transmission by the serial communication unit 8122 is continued at constant time intervals (e.g., 100 ms) until the printer 800 becomes a power off status. Note that it may be arranged such that upon initialization accompanying power-on, the existence/absence of external battery charger 900 is detected, and only if the battery charger 900 exists, the serial data transmission is performed. Further, in the printer 800, if a print command is not received, the print head 8108 is capped and a transition to the stand-by status is made, then the charging enable instruction (electric charging is continued: D0=1) is set as the transmission data by the serial communication unit 8122, and transmits the data to the battery charger 900.

As described above, as battery charging is performed when the print head is capped, the period of driving of the motors 114, 118 and 8107 and the print head 8108 in print processing can be automatically skipped and the electric charging is performed. Thus automatic electric charging with reduced waste of time can be realized.

Further, as the electric charging control is not influenced by noise caused by the driving current in the motors and the print head 8108, the accuracy of full-charge detection can be improved.

Note that in the above description, at step S2, determination is made based on whether or not a print command from the host device has been received, however, the invention is also applicable to a case where the determination is made based on whether or not a self-test print command is to be issued.

Further, it may be arranged such that the print command at step S2 is replaced with a request for processing of temporarily opening the cap such as a cleaning processing command for the print head 8108, an ink cartridge replace operation command, an initialization processing command for the printer 800 or a power-off processing command for the printer 800, and the processing at step S4 is replaced with a processing operation corresponding to the command at step S2. That is, as the electric charging skip control can be realized, without performing respective electric charging skip control on the various motors and the print head, only based on whether or not the print head is capped, the load on the software is reduced. Further, as it is determined whether or not the print head 8108 is in a stand-by position based on whether or not the print head is capped, it is not necessary to provide a specialized sensor for detection of carriage home position, thus cost increase can be suppressed.

Figure 12:
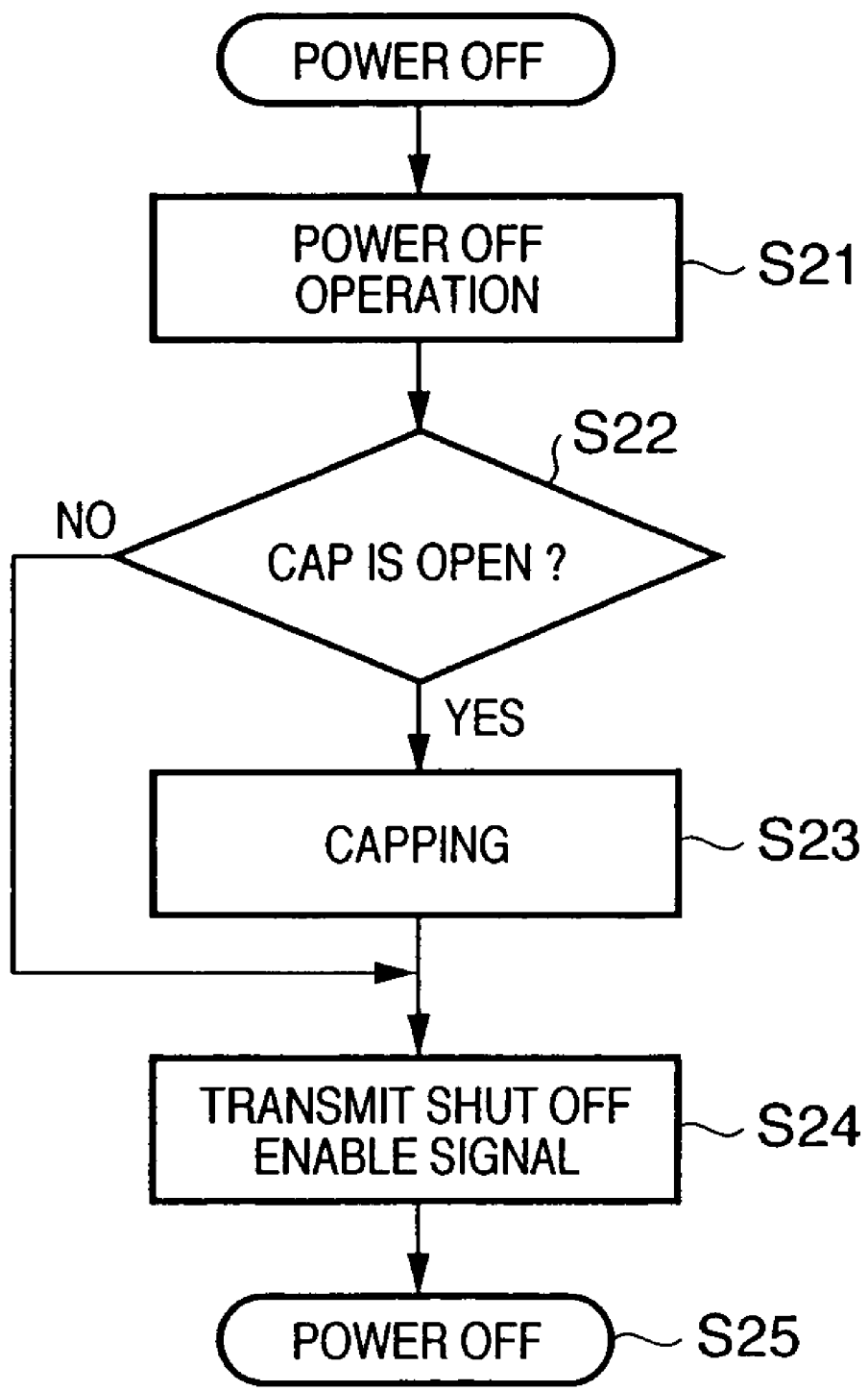
FIG. 12 is a flowchart showing power off processing in the ink jet printer according to the embodiment.

FIG. 12 is a flowchart showing processing upon power off in the ink jet printer 800 according to the present embodiment. The program is stored in the ROM 8104, and it is executed based on the control processing by the controller 8101. Note that in the case of the flowcharts of FIGS. 13 and 14, the program is stored in the ROM 8104 and it is executed based on the control processing by the controller 8101.

First, at step S21, when a power off operation has been instructed by the operation of the power key 8124 of the ink jet printer 800 or actuation of an included auto power off function, the process proceeds to step S22, at which it is determined whether or not the cap to cover the print head 8108 is open. If it is determined that the print head is not capped, the process proceeds to step S23, at which the print head 8108 is capped, and the process proceeds to step S24. Note that the determination as to whether or not the print head 8108 is capped can be made based on the above-described cap flag.

Further, if it is determined at step S22 that the print head 8108 is capped, the process proceeds to step S24, at which the shut off enable instruction is transmitted to the battery charger 900. The instruction from the ink jet printer 800 to the battery charger 900 is made by setting the bit D1 of the data as shown in FIG. 9B to "1". The process proceeds to step S25, at which the ink jet printer 800 is set to the power off status.

Figure 13:
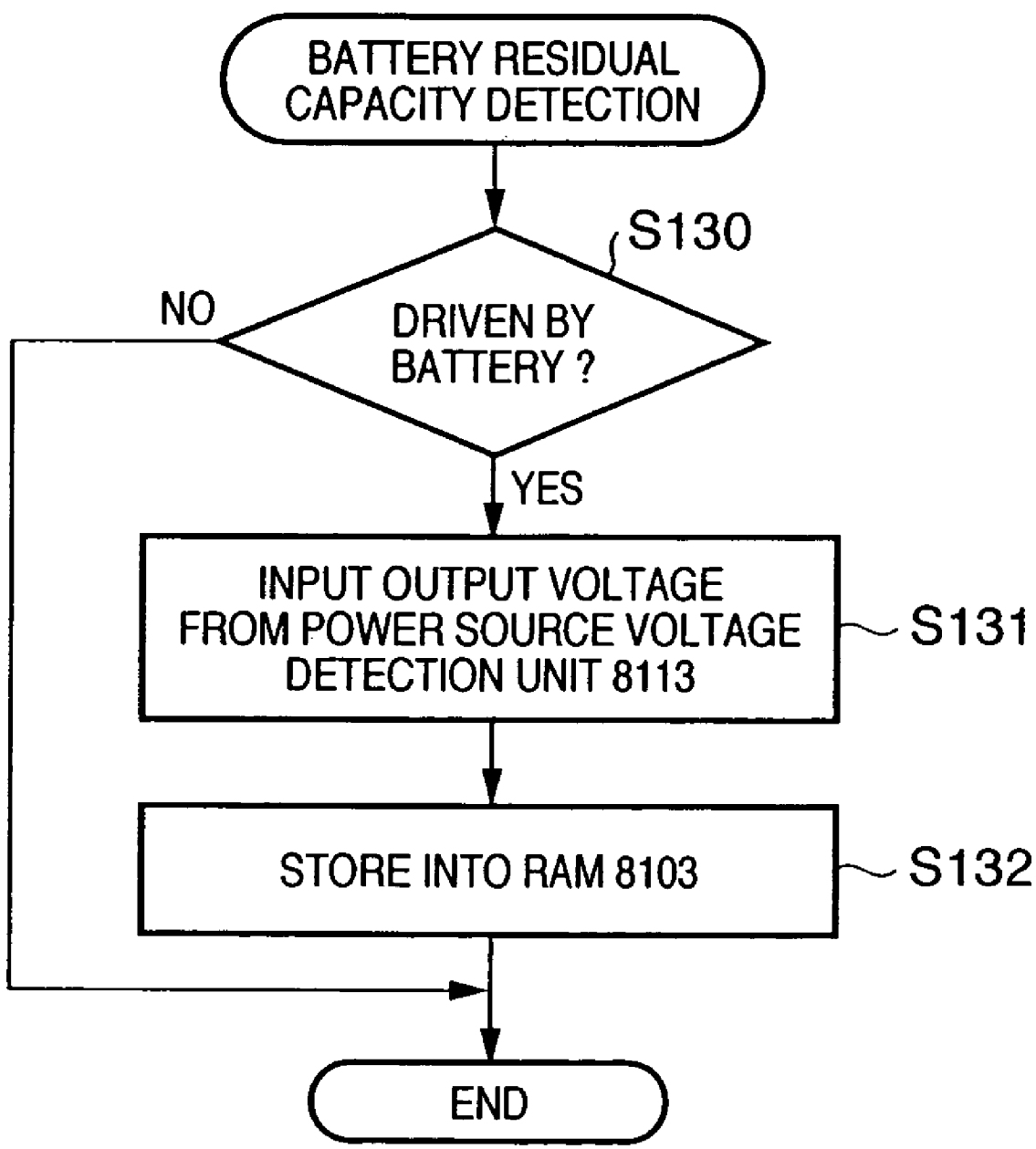
FIG. 13 is a flowchart showing battery residual capacity detection processing in the ink jet printer according to the embodiment.

FIG. 13 is a flowchart showing battery residual capacity (electric power) detection processing in the ink jet printer 800 according to the embodiment. Note that upon print sheet feeding or immediately before paper discharging, or upon disconnection from the AC adapter 200, the conveyance motor 118 is dummy-excited and the processing is executed at this timing, since it is desirable to measure the battery residual capacity in a status where the load is under a predetermined load which is comparatively stable.

First, at step S130, it is determined based on the power source voltage detected by the power source voltage detection unit 8113 whether the power source unit 8112 is driven with the DC voltage from the AC adapter 200 or with the electric power from the battery pack 300. If it is determined that the power source unit 8112 is not driven with the battery (in a case where the power source voltage is equal to or higher than a predetermined value), the process ends, while if it is determined that the power source unit 8112 is driven with the battery pack 300, the process proceeds to step S131, at which the voltage value detected by the power source voltage detection unit 8113 is inputted, and the input value is stored into the RAM 8103 at step S132.

Figure 14:
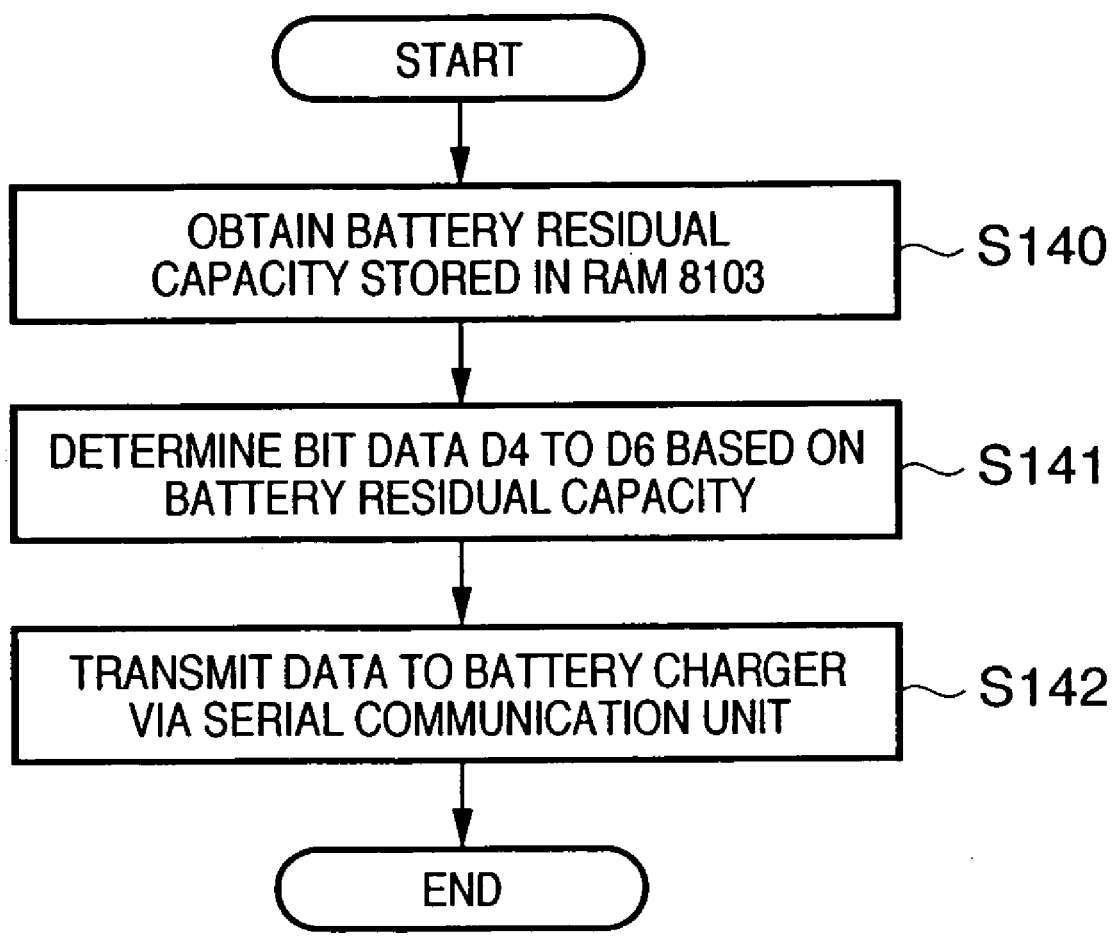
FIG. 14 is a flowchart showing battery residual capacity notification processing in the ink jet printer according to the embodiment.

Next, processing of notifying the battery residual capacity from the ink jet printer 800 to the battery charger 900 will be described with reference to the flowchart of FIG. 14. Note that in a case where the power source of the ink jet printer 800 is on and the printer 800 is driven with an electric power from the battery pack 300, the processing is started by e.g. 100 ms.

When the processing is started, first, at step S140, the output voltage value stored in the RAM 8103 at the above-described step S132 is read. Then at step S141, the 3 bit data indicating the battery residual capacity (electric power) (bits D4 to D6 in FIG. 9B) is determined in correspondence with the output voltage value. Then at step S142, the data is transmitted via the serial communication unit 8112 to the battery charger 900.

Next, processing in the battery charger 900 according to the present embodiment will be described with reference to the flowcharts of FIGS. 15 to 19. Note that the control program for execution of the processing is stored in an ROM (not shown) of the 1-chip microcomputer 401, and realized by execution of the control operation by the 1-chip microcomputer 401 in accordance with the program.

Figure 15:
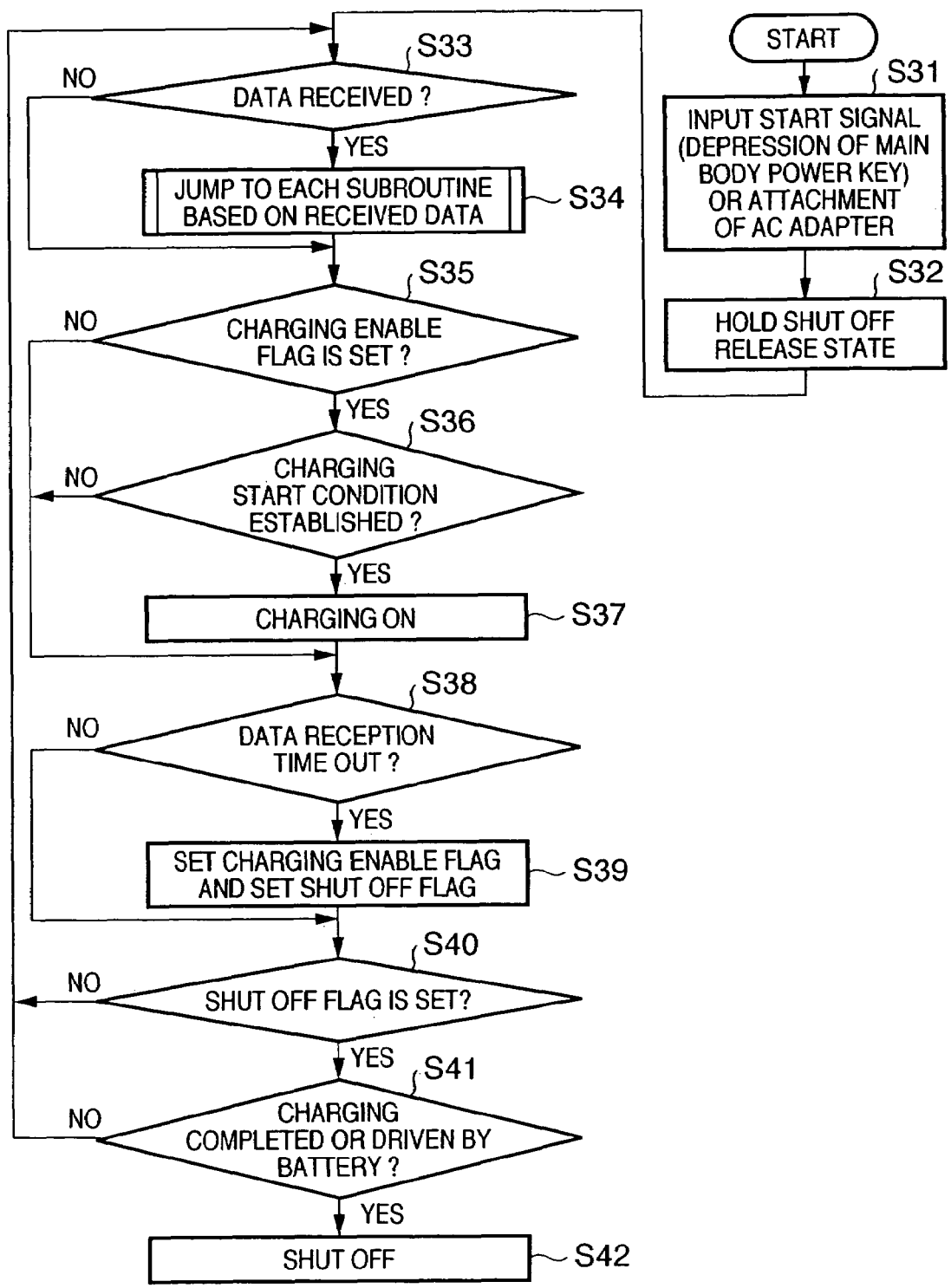
FIG. 15 is a flowchart showing processing in the battery charger according to the embodiment.

FIG. 15 is a flowchart showing the entire processing in the battery charger 900 according to the embodiment.

First, at step S31, when the power-on is instructed by depression of the power key 8124 of the ink jet printer 800 (or when the AC adapter 200 is connected/disconnected), the instruction is sent as the power key signal 411 to the battery charger 900. The process proceeds to step S32, at which the shut off status up to that time is released and the power source of the battery charger 900 is turned on. Then the execution of the control program included in the 1-chip microcomputer 401 is started. At step S32, to hold the shut off released status, the outputs from the battery pack 300 and the shut off switch 409 are enabled by the shut off control units 421 and 424.

Next, the process proceeds to step S33, at which it is determined whether or not the data from the ink jet printer 800 has been received by serial communication unit 422. As described above, in the ink jet printer 800, when the power source is turned on and the initialization processing is executed, the shut off disable instruction (D1=1) is transmitted to the battery charger 900 via the serial communication unit 8122 at step S1 in FIG. 11. Accordingly, in the battery charger 900, if it is determined at step S33 that the shut off disable instruction has been received, the process proceeds to step S34, at which processing corresponding to the received data is performed.

Figure 16:
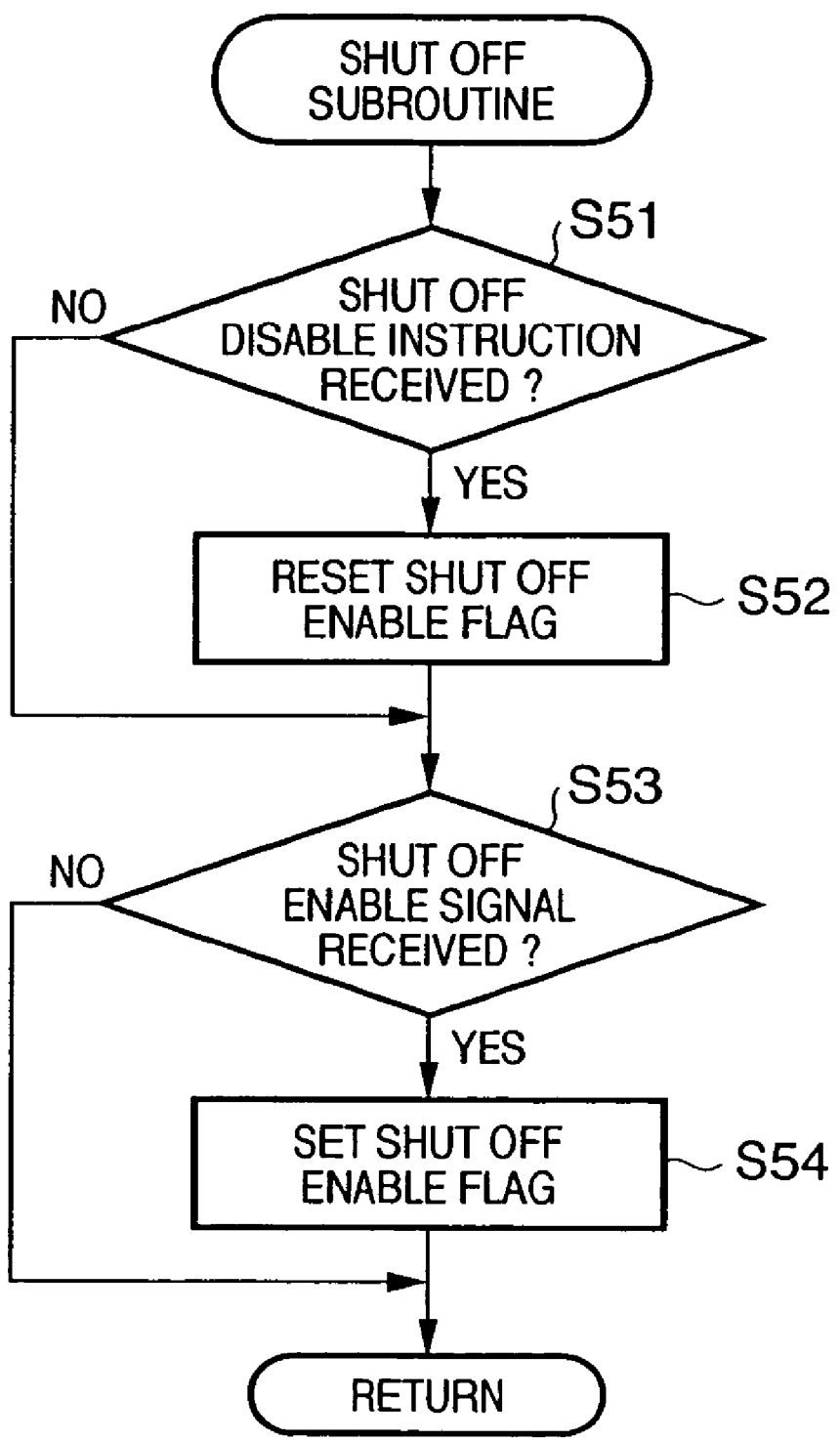
FIG. 16 is a flowchart showing shut off processing in the battery charger according to the embodiment.

FIG. 16 is a flowchart showing the processing at step S34 upon reception of the shut off disable instruction.

At step S51, if it is determined that the received data is the shut off disable instruction, the process proceeds to step S52, at which a shut off enable flag in the 1-chip microcomputer 401 is turned off (reset). On the other hand, if it is determined that the received data is not the shut off disable instruction, the process proceeds to step S53, at which the shut off enable flag in the memory of the 1-chip microcomputer 401 is turned on. In the battery charger 900, when the shut off enable flag is on, if it is determined that the electric charging of the battery pack 300 is not necessary, the battery charger 900 shifts to the shut off status.

Next, returning to FIG. 15, if no data has been received from the ink jet printer 800 at step S33, or after the execution of step S34, the process proceeds to step S35, at which it is determined whether or not an electric charging enable flag in the memory of the 1-chip microcomputer 401 is on. If the electric charging enable flag is on, the process proceeds to step S36, at which it is determined whether or not a condition for electric charging of the battery pack 300, e.g., whether or not electric power is being supplied from the AC adapter 200, whether or not the temperature of the battery 301 is normal, or whether or not the battery charging is uncompleted, is established. If the condition is established, the process proceeds to step S37, at which the power source voltage from the AC adapter 200 is inputted into the DC-DC converter 403 by the shut off switch 409, and the output therefrom is supplied to the battery pack 300, thereby electric charging of the battery pack is started. Then the process proceeds to step S38.

Note that if the voltage value detected by the power source voltage detection unit 406 is equal to or higher than a predetermined value, the microcomputer 401 of the battery charger 900 determines that the electric power from the AC adapter 200 is supplied, then detects the output voltage from the battery pack 300 based on the voltage value detected by the charging voltage detection unit 404, and determines whether or not electric charging of the battery is necessary. Further, the determination as to whether or not the temperature of the battery is normal is made based on the result of detection by the battery temperature detection unit 407.

On the other hand, if it is determined at step S35 that the charging flag is off, or if it is determined at step S36 that the electric charging condition is not established, the process proceeds to step S38, at which it is determined whether or not a so-called time out, a status where the signal periodically inputted when the ink jet printer 800 is on has not been inputted for a predetermined or longer period, has occurred. If it is determined that a time out has occurred, the process proceeds to step S39, at which the electric charging enable flag and the shut off flag are turned on, and the process proceeds to step S40.

Further, if it is determined at step S38 that a time out in data reception has not occurred, the process proceeds to step S40, at which it is determined whether or not the shut off flag is set. If it is determined that the shut off flag is not set, the process returns to step S33, while if it is determined that the shut off flag is set, the process proceeds to step S41, at which it is determined whether or not the electric charging of the battery pack 300 has been completed or whether or not the printer is driven with the electric power from the battery pack 300. If the electric charging has not been completed or the printer is not driven with the electric power from the battery pack 300, the process returns to step S33, while if the electric charging has been completed or the printer is driven with the electric power from the battery pack 300, the process proceeds to step S42 to shift to the shut off mode. In the shut off processing at step S42, the completion of the electric charging of the battery pack 300 is waited, then the output from the battery pack 300 and the shut off switch 409 are turned off by the shut off control units 421 and 424, and the process shifts to the shut off status. Upon the shut off processing, if it is necessary to electrically charge the battery pack 300, then the electric charging process is implemented and after then the shut off processing is implemented.

Figure 17:
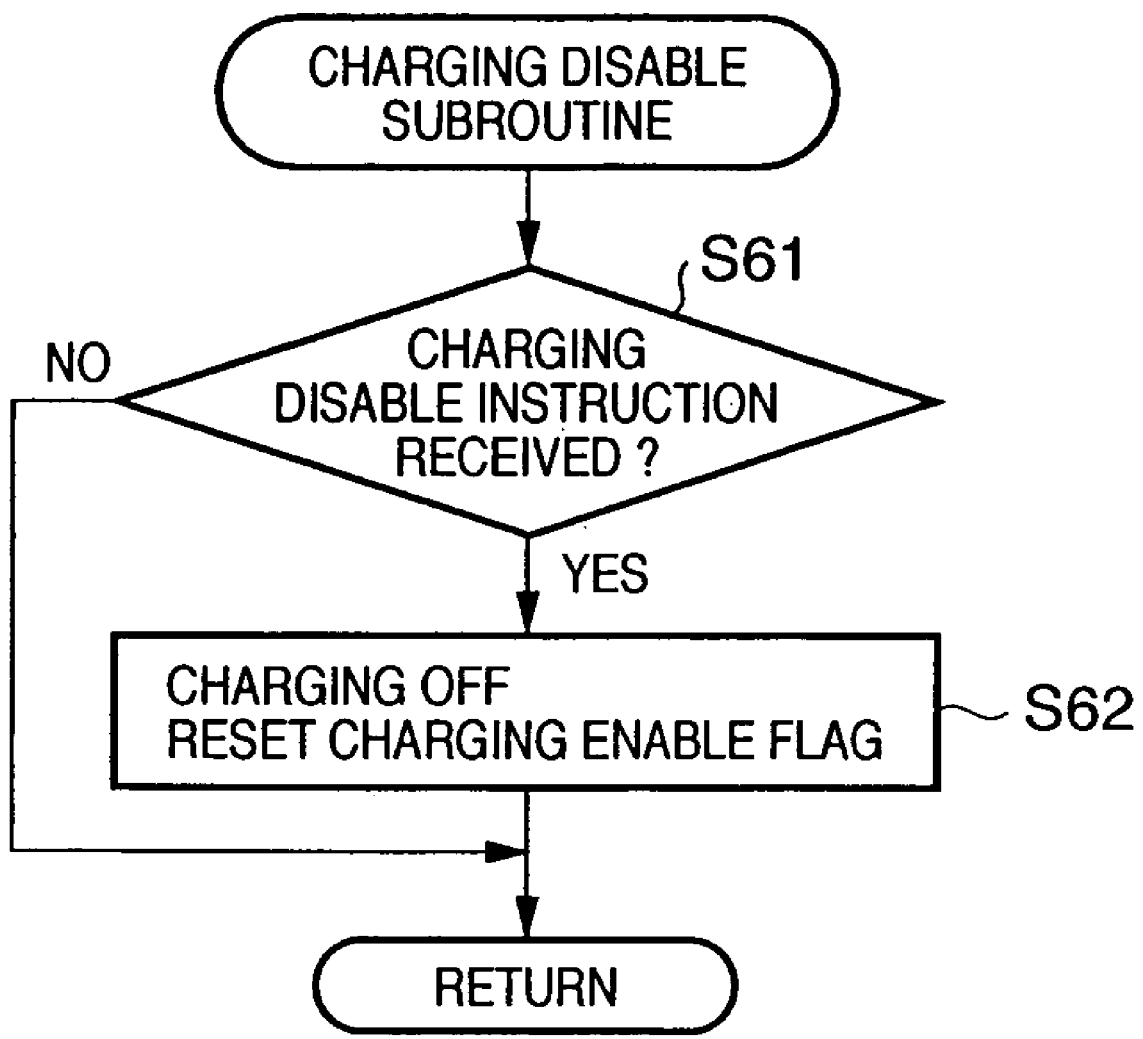
FIG. 17 is a flowchart showing processing upon reception of charging disable signal in the battery charger according to the embodiment.

FIG. 17 is a flowchart showing processing when the electric charging disable (charging suspension) information is included in the data received by the serial communication unit 422 at step S34.

First, at step S61, it is determined whether or not the bit D0 of the data received by the serial communication unit 422 is "0", i.e., in the battery charger 900, it is determined whether or not the charging suspension information (D0=0) indicating that the electric charging of the battery pack 300 is disabled is included. If it is determined that the charging suspension information is included in the data, the process proceeds to step S62, at which the electric charging processing is suspended by the 1-chip microcomputer 401, then the charging enable flag in the memory of the 1-chip microcomputer 401 is reset, and the process returns.

Figure 18:
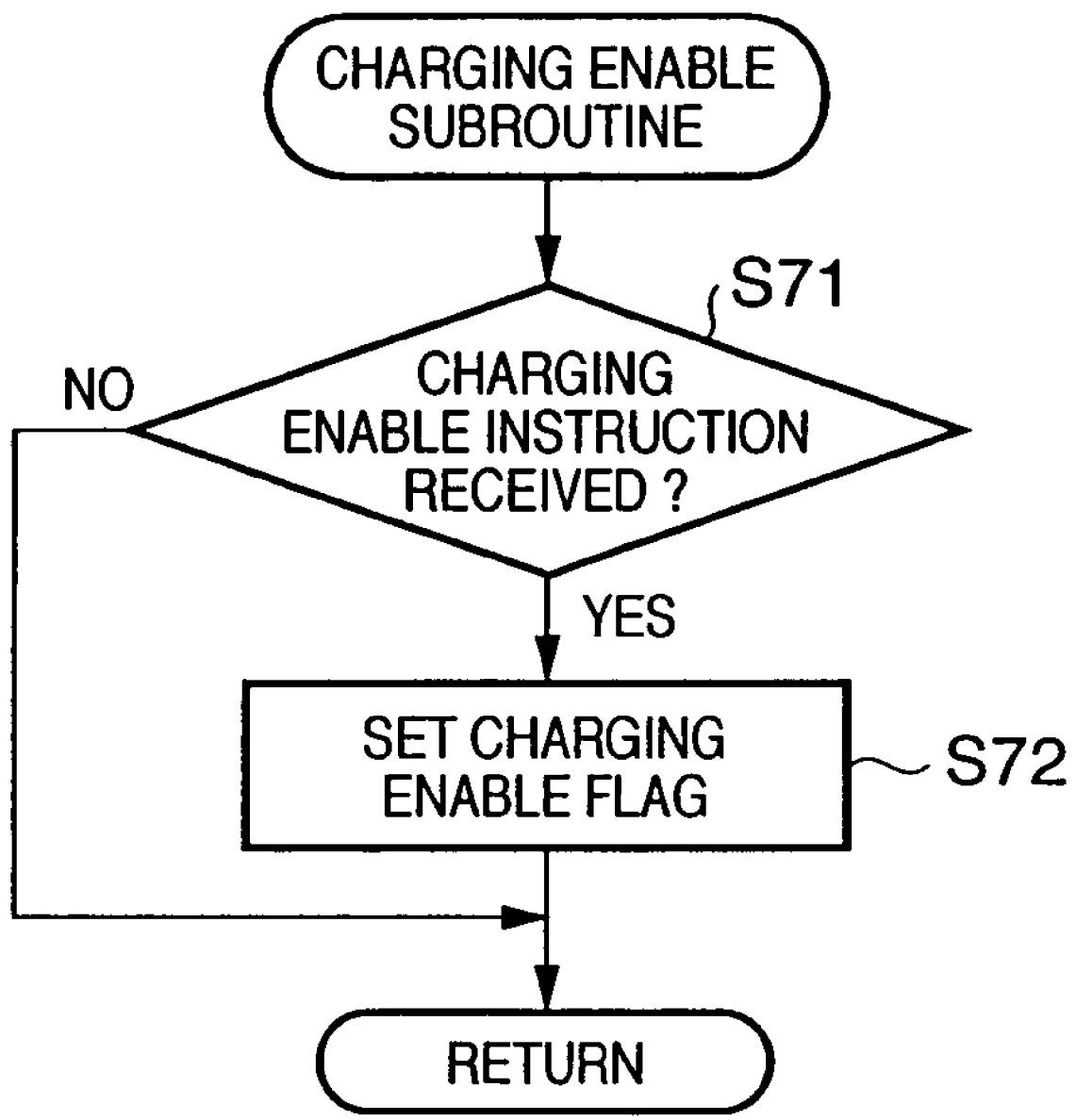
FIG. 18 is a flowchart showing processing upon reception of charging enable signal in the battery charger according to the embodiment.

FIG. 18 is a flowchart showing processing when the charging enable (electric charging is continued) information is included in the data received by the serial communication unit 422 at step S34.

First, at step S71, it is determined whether or not the bit D0 of the data received by the serial communication unit 422 is "1", i.e., in the battery charger 900, it is determined whether or not the charging enable information (D0=1) indicating that the electric charging of the battery pack 300 is enabled is included. If it is determined that the charging suspension information is included in the data, the process proceeds to step S72, at which the charging enable flag in the memory of the 1-chip microcomputer 401 is set, and the process returns.

By this processing, at step S35 in FIG. 15, it is determined that the charging enable flag is set and the process proceeds to step S36, at which it is determined whether or not the electric charging condition is satisfied. If the electric charging condition is satisfied, the process proceeds to step S37, at which the electric charging of the battery pack 300 is started.

Note that in addition to the above-described embodiment, it may be arranged such that an instruction is issued to the battery charger 900 to change the charging current to a small current or a large current by using e.g. the bit D2 of the data in FIG. 9B, in correspondence with a change of battery temperature, the charging voltage or the like.

Figure 19:
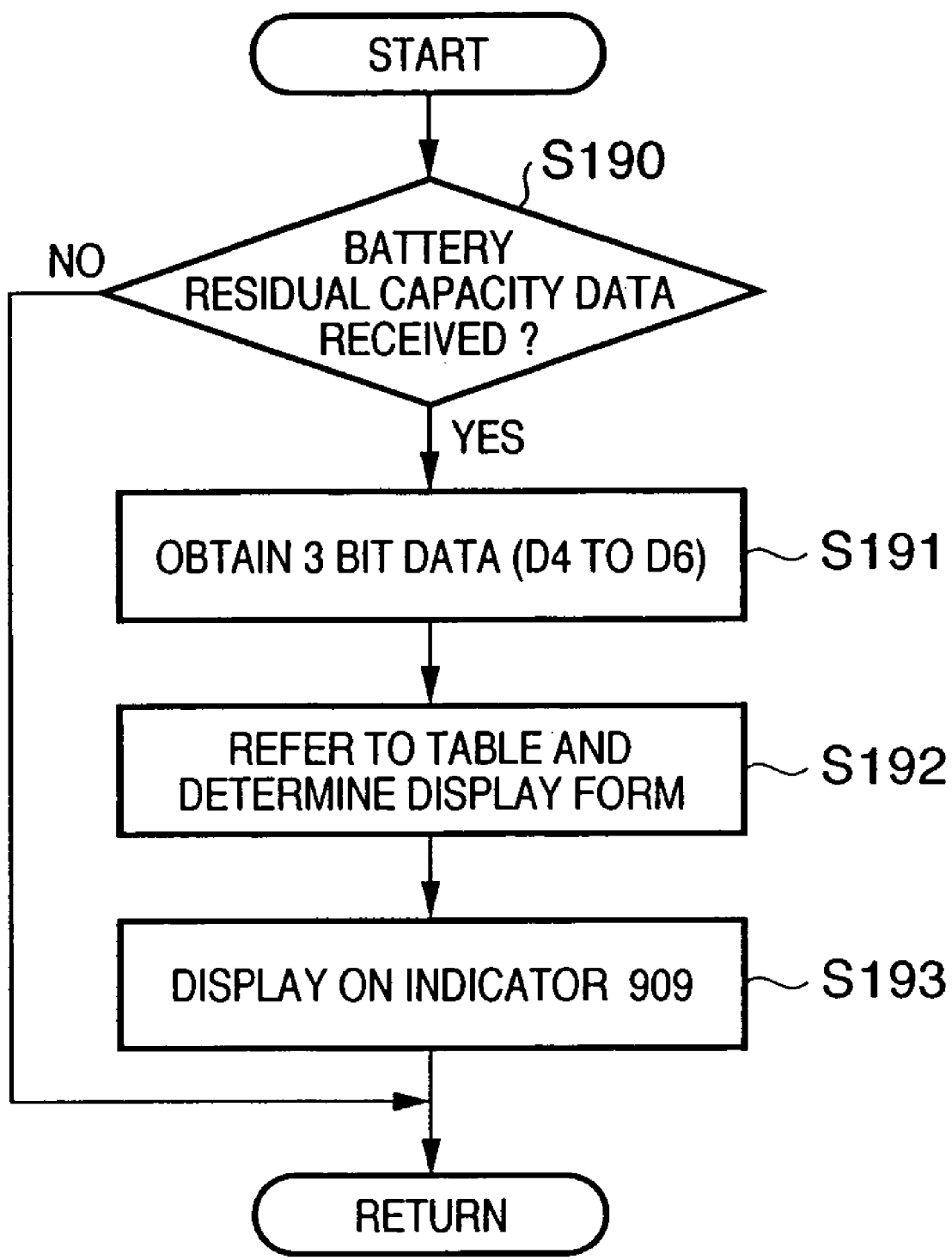
FIG. 19 is a flowchart showing processing upon reception of battery residual capacity data in the battery charger according to the embodiment.

FIG. 19 is a flowchart showing processing upon reception and display of the battery residual capacity (electric power) data in the battery charger 900 according to the embodiment. The processing is executed if it is determined at step S34 in FIG. 15 that the data on indication of battery residual capacity is included in the received serial data.

First, at step S190, if it is determined that the data received by the serial communication unit 422 includes data on indication of battery residual capacity, the process proceeds to step S191, at which the 3 bit data (D4 to D6) included in the 1 byte data is obtained. Then at step S192, a pattern of residual capacity indication on the charge indicator 909 is determined by referring to a table. At step S193 the pattern of residual capacity indication is displayed on the charge indicator 909.

By this processing, the battery charger 900 can notify the user of the battery residual capacity with indication of the residual capacity of the battery pack 300 in an approximately real time manner.

Other Embodiment

The present invention can be applied to a system constituted by a plurality of devices (e.g., a host computer, an interface, a reader and a printer) or to an apparatus comprising a single device (e.g., a copy machine or a facsimile apparatus).

Further, the object of the present invention can also be achieved by providing a storage medium (or recording medium) holding software program code for performing the aforesaid processes to a system or an apparatus, reading the program code with a computer (e.g., CPU, MPU) of the system or apparatus from the storage medium, then executing the program.

In this case, the program code read from the storage medium realizes the functions according to the embodiment, and the storage medium holding the program code constitutes the invention.

Further, the storage medium, such as a floppy disk, a hard disk, an optical disk, a magneto-optical disk, a CD-ROM, a CD-R, a DVD, a magnetic tape, a non-volatile type memory card, and ROM can be used for providing the program code.

Furthermore, besides aforesaid functions according to the above embodiment are realized by executing the program code which is read by a computer, the present invention includes a case where an OS (operating system) or the like working on the computer performs a part or entire actual processing in accordance with designations of the program code and realizes functions according to the above embodiment.

Furthermore, the present invention also includes a case where, after the program code read from the storage medium is written in a function expansion card which is inserted into the computer or in a memory provided in a function expansion unit which is connected to the computer, CPU or the like contained in the function expansion card or unit performs a part or entire process in accordance with designations of the program code and realizes functions of the above embodiment.

In FIG. 11, if the ink jet printer 800 is driven by the AC adapter 200 at step S13, then the printer 800 may send an electric charging enable signal to the battery charger 900 without determining whether or not an electric charging is necessary, and the battery charger 900 may determine whether or not the electric charging of the battery pack 300 is performed. In this case, the micro computer 401 of the battery charger 900 determines whether the battery pack 300 is full charged based on signals from the charging current detection unit 405 and the charging voltage detection unit 404, and if the charger 900 determines it is necessary to electrically charge the battery pack 300, then performs the electric charging processing. The micro computer 401 determines that the battery pack 300 is fully charged based on the signals from the charging current detection unit 405 and the charging voltage detection unit 404 to terminate the electric charging processing.

As described above, according to the present embodiment, an electric charging apparatus or an electric charging apparatus with an electric charge indication unit is attachable/removable to/from an electronic apparatus main body which can be driven with a battery, and a battery residual capacity is detected by the electronic apparatus. The result of detection of residual capacity of a secondary battery of the electric charging apparatus is transmitted to the electric charging apparatus as an optional device and the battery residual capacity is displayed there. Accordingly, cost increase and upsizing in the electronic apparatus main body and the electric charging apparatus can be minimized.

The present invention is not limited to the above embodiments and various changes and modifications can be made within the spirit and scope of the present invention. Therefore, to appraise the public of the scope of the present invention, the following claims are made.

What is claimed is:

1. An electric charging apparatus being attachable to a printer that is driven with electric power supplied from said electric charging apparatus while said electric charging apparatus is attached to the printer, said electric charging apparatus comprising:

a battery;

an electric power input unit configured to input a driving voltage based on a commercial power source;

a power source relay unit configured to output a higher voltage of the driving voltage output by said electric power input unit and an output voltage of said battery;

a terminal configured to supply the voltage output from said battery power source relay unit to the printer while said electric charging apparatus is attached to the printer;

a reception unit configured to receive, from the printer, residual capacity information corresponding to a battery residual capacity of said battery, in a case that said electric charging apparatus is attached to the printer and said power source relay unit outputs the output voltage from said battery;

a display unit configured to display the battery residual capacity of said battery; and a display control unit configured to cause said display unit to display the battery residual capacity of said battery based on the residual capacity information received from the printer by said reception unit, wherein the residual capacity of said battery is detected by the printer based on the electric power being supplied via said terminal from said power source relay unit to the printer while the electric charging apparatus is attached to said printer.

2. The charging apparatus according to claim 1, wherein said display control unit displays a display pattern in correspondence with the residual capacity information.

* * * * *